US008230298B2

(12) United States Patent
Tran et al.

(10) Patent No.: US 8,230,298 B2
(45) Date of Patent: *Jul. 24, 2012

(54) OVERLAPPING SUB-MATRIX BASED LDPC (LOW DENSITY PARITY CHECK) DECODER

(75) Inventors: Hau Thien Tran, Irvine, CA (US); Kelly Brian Cameron, Irvine, CA (US); Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 325 days.

This patent is subject to a terminal disclaimer.

(21) Appl. No.: 12/651,453

(22) Filed: Jan. 1, 2010

(65) Prior Publication Data

US 2010/0138721 A1 Jun. 3, 2010

Related U.S. Application Data

(63) Continuation of application No. 11/709,078, filed on Feb. 21, 2007, now Pat. No. 7,644,339.

(60) Provisional application No. 60/848,834, filed on Oct. 2, 2006.

(51) Int. Cl.
*H03M 13/00* (2006.01)

(52) U.S. Cl. ........................................ 714/758; 714/804

(58) Field of Classification Search .................. 341/107; 714/752, 800, 757, 801, 758, 804
See application file for complete search history.

(56) References Cited

U.S. PATENT DOCUMENTS

| | | | | | |
|---|---|---|---|---|---|
| 3,542,756 | A * | 11/1970 | Gallager | 714/762 |
| 3,665,396 | A * | 5/1972 | Forney, Jr. | 714/789 |
| 4,295,218 | A * | 10/1981 | Tanner | 714/762 |
| 6,430,233 | B1 * | 8/2002 | Dillon et al. | 375/316 |
| 6,473,010 | B1 * | 10/2002 | Vityaev et al. | 341/107 |
| 6,567,465 | B2 * | 5/2003 | Goldstein et al. | 375/222 |
| 6,633,856 | B2 * | 10/2003 | Richardson et al. | 706/15 |
| 6,715,121 | B1 * | 3/2004 | Laurent | 714/758 |
| 2006/0085720 | A1 | 4/2006 | Tran et al. | |

FOREIGN PATENT DOCUMENTS

| | | | |
|---|---|---|---|
| EP | 1612948 | A1 | 1/2006 |
| WO | 2006059688 | A1 | 6/2006 |

* cited by examiner

Primary Examiner — David Ton
(74) *Attorney, Agent, or Firm* — Garlick & Markison; Shayne X. Short

(57) ABSTRACT

Overlapping sub-matrix based LDPC (Low Density Parity Check) decoder. Novel decoding approach is presented, by which, updated bit edge messages corresponding to a sub-matrix of an LDPC matrix are immediately employed for updating of the check edge messages corresponding to that sub-matrix without requiring storing the bit edge messages; also updated check edge messages corresponding to a sub-matrix of the LDPC matrix are immediately employed for updating of the bit edge messages corresponding to that sub-matrix without requiring storing the check edge messages. Using this approach, twice as many decoding iterations can be performed in a given time period when compared to a system that performs updating of all check edge messages for the entire LDPC matrix, then updating of all bit edge messages for the entire LDPC matrix, and so on. When performing this overlapping approach in conjunction with min-sum processing, significant memory savings can also be achieved.

20 Claims, 26 Drawing Sheets

| | | | | | | | | | |
|---|---|---|---|---|---|---|---|---|---|
| — | — | — | — | — | — | × | × | × | × |
| $S_{2,1}$ | $S_{2,2}$ | ooo | $S_{2,59}$ | $S_{2,60}$ | — | × | × | × | × |
| $S_{3,1}$ | $S_{3,2}$ | ooo | $S_{3,59}$ | × | $S_{3,61}$ | — | × | × | × |
| $S_{4,1}$ | $S_{4,2}$ | ooo | $S_{4,59}$ | × | × | $S_{4,62}$ | — | × | × |
| $S_{5,1}$ | $S_{5,2}$ | ooo | $S_{5,59}$ | × | × | × | $S_{5,63}$ | — | × |
| $S_{6,1}$ | $S_{6,2}$ | ooo | $S_{6,59}$ | × | × | × | × | $S_{6,64}$ | — |

↑ ↑ ↑ ↑ ↑ ↑
0 0 0 0 0 0

72 of 6-message input bit engines initialization 900

| | | | | | | | | | | |
|---|---|---|---|---|---|---|---|---|---|---|
| — | — | ooo | — | — | × | × | × | × | × | × |
| → | $S_{2,1}$ | → $S_{2,2}$ | ooo | $S_{2,59}$ | $S_{2,60}$ | — | × | × | × | × |
| → | $S_{3,1}$ | → $S_{3,2}$ | ooo | $S_{3,59}$ | × | $S_{3,61}$ | — | × | × | × |
| → | $S_{4,1}$ | → $S_{4,2}$ | ooo | $S_{4,59}$ | × | × | $S_{4,62}$ | — | × | × |
| → | $S_{5,1}$ | → $S_{5,2}$ | ooo | $S_{5,59}$ | × | × | × | $S_{5,63}$ | — | × |
| → | $S_{6,1}$ | → $S_{6,2}$ | ooo | $S_{6,59}$ | × | × | × | × | $S_{6,64}$ | — |
| 0 | 0 | 0 | 0 | 0 | 0 | | | | | |

initialization 1000

72 of 6-message input bit engines

72×6 of 1-message input check engines

1400

72x6 of 1-message input check engines →

| | | | | | | | | | |
|---|---|---|---|---|---|---|---|---|---|
| – | – | OOO | – | – | X | X | X | X | X |
| $S_{2,1}$ | $S_{2,2}$ | OOO | $S_{2,59}$ | $S_{2,60}$ | – | X | X | X | X |
| $S_{3,1}$ | $S_{3,2}$ | OOO | $S_{3,59}$ | X | $S_{3,61}$ | – | X | X | X |
| $S_{4,1}$ | $S_{4,2}$ | OOO | $S_{4,59}$ | X | X | $S_{4,62}$ | – | X | X |
| $S_{5,1}$ | $S_{5,2}$ | OOO | $S_{5,59}$ | X | X | X | $S_{5,63}$ | – | X |
| $S_{6,1}$ | $S_{6,2}$ | OOO | $S_{6,59}$ | X | X | X | X | $S_{6,64}$ | – |

Fig. 14

OVERLAPPING SUB-MATRIX BASED LDPC (LOW DENSITY PARITY CHECK) DECODER

CROSS REFERENCE TO RELATED PATENTS/PATENT APPLICATIONS

Continuation Priority Claim, 35 U.S.C. §120

The present U.S. Patent Application claims priority pursuant to 35 U.S.C. §120, as a continuation, to the following U.S. Patent Application which is hereby incorporated herein by reference in its entirety and made part of the present U.S. Patent Application for all purposes:

1. U.S. application Ser. No. 11/709,078, entitled "Overlapping sub-matrix based LDPC (Low Density Parity Check) decoder," filed Feb. 21, 2007, and scheduled to be issued as U.S. Pat. No. 7,644,339 on Jan. 5, 2010, which claims priority pursuant to 35 U.S.C. §119(e) to the following U.S. Provisional Patent Application which is hereby incorporated herein by reference in its entirety and made part of the present U.S. Patent Application for all purposes:

a. U.S. Provisional Application Ser. No. 60/848,834, entitled Overlapping sub-matrix based LDPC (Low Density Parity Check) decoder," filed Oct. 2, 2006.

BACKGROUND OF THE INVENTION

1. Technical Field of the Invention

The invention relates generally to communication systems; and, more particularly, it relates to decoding of LDPC (Low Density Parity Check) coded signals within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

In such prior art communication devices, one of the greatest hurdles and impediments in designing effective communication devices that can decode LDPC coded signals is the typically large area and memory required to store and manage all of the updated bit edge messages and check edge messages that are updated and employed during iterative decoding processing (e.g., when storing and passing the check edges messages and the bit edges messages back and forth between a check engine and a bit engine, respectively). When dealing with relatively large block sizes in the context of LDPC codes, the memory requirements and memory management need to deal with these check edges messages and bit edges messages can be very difficult to handle.

Prior art approaches to performing decoding of LDPC coded signals are inherent memory intensive, in that, the typical prior art approach is such that (1) all of the bit edge messages are updated, then (2) all of the check edge messages are updated, then (3) all of the bit edge messages are updated, and so on, until a solution is arrived at or until a fixed number of decoding iterations has been performed. Especially for LDPC coded signals employing a relatively large block size, this prior art approach requires a significant amount of memory, oftentimes intensive memory management design, and these increase the size and cost of devices that are designed to decode LDPC coded signals using according to this prior art approach.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 9, FIG. 10, FIG. 11, FIG. 12, FIG. 13, FIG. 14, FIG. 15, FIG. 16, and FIG. 17 illustrate an embodiment of overlapping sub-matrix based decoding for an LDPC coded signal whose LDPC matrix, H, having (1) 72×72 sized CSI (Cyclic Shifted Identity) sub-matrices, (2) bit degree of 6,2,1 and check degree of 60,61, and (3) a total number of edges of 26,280.

DETAILED DESCRIPTION OF THE INVENTION

Figure 1:
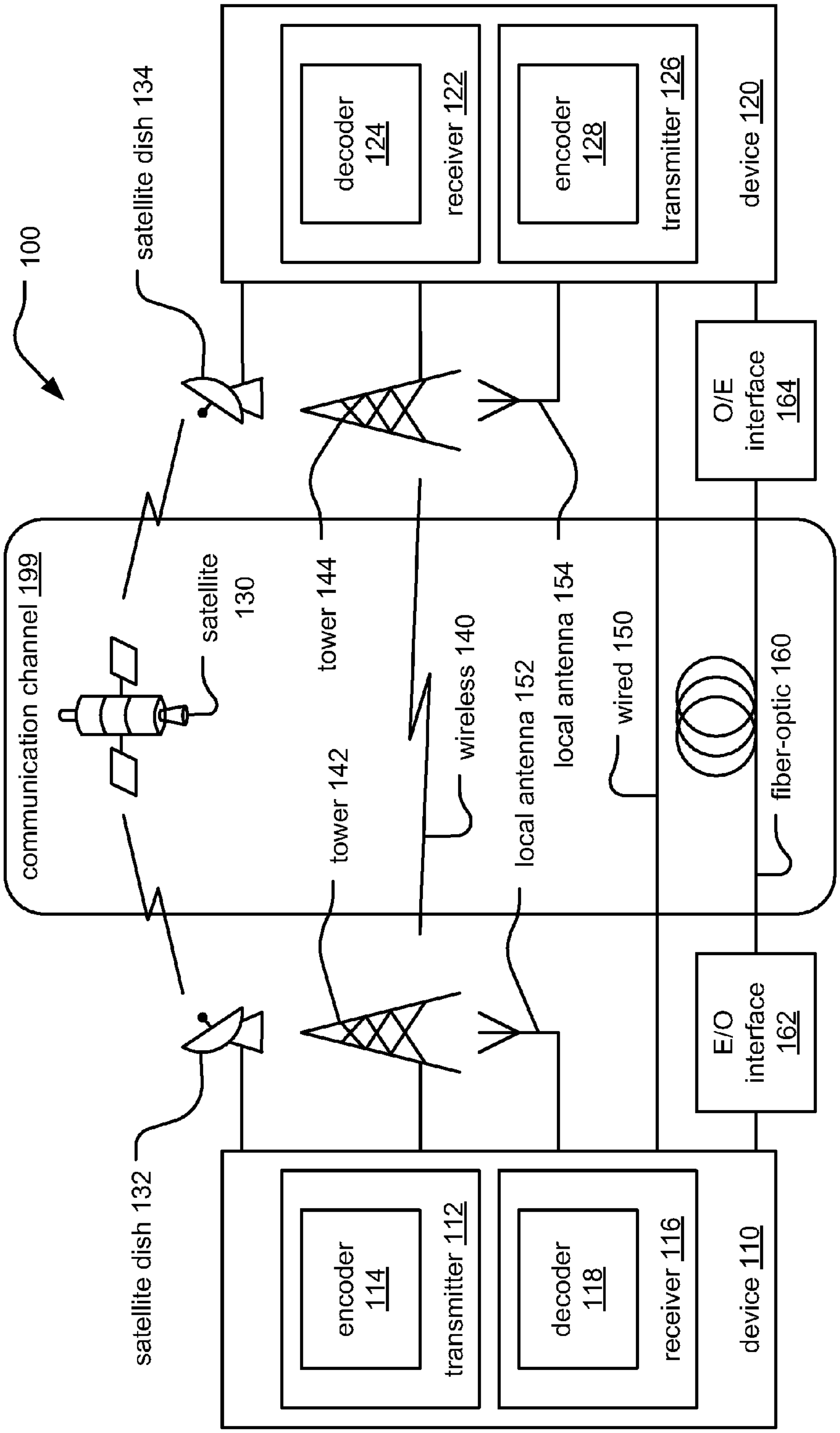
FIG. 1 and FIG. 2 illustrate various embodiments of communication systems.

Many communication systems incorporate the use of an LDPC (Low Density Parity Check) code. Typically, previous approaches operate under the supposition that updating of all check edge messages (which is sometimes referred to as check node processing) and updating of all bit edge messages (which is sometimes referred to as bit node processing) are performed alternatively (i.e., all of the check edge messages are updated, and then all of the bit edge messages are updated).

Herein, a novel approach is presented by which virtually no memory is required, in that, the check edges messages and the bit edges messages are passed directly between a check engine and a bit engine, respectively, when performing iterative decoding processing of an LDPC coded signal. By employing an appropriate sub-matrix based processing approach, the updating of the check edge messages of one or more of the sub-matrices can begin long before the updating of the bit edge messages of the entire LDPC matrix, H, have been updated. Generally speaking, this is overlapped approach in which once the bit edge messages of a sub-matrix have been updated, then they can be used immediately thereafter for updating of the check edge messages for that sub-matrix. In other embodiments, only a portion of the sub-matrix can undergo the updating of the bit edge messages followed by the check edge messages for that portion of the sub-matrix.

If desired, the structure of the LDPC code (e.g., the structure of the LDPC matrix, H) can be performed such that the LDPC code structure is appropriated for a more efficient implementation of an overlapping sub-matrix based LDPC decoder. That is to say, the LDPC matrix, H, can be designed so that it benefits more directly from the architecture and processing flow of an overlapping sub-matrix based LDPC decoder. Thereafter, once the LDPC code structure has been arrived at, then the LDPC matrix, H, can undergo any amount of row and column permutation, as desired, to randomize the sub-matrices therein. For example, this permuting of the LDPC matrix, H, can involve performing cyclic shifting as in the context of CSI (Cyclic Shifted Identity) sub-matrices, as well as randomly distributing the non-zero elements within the LDPC matrix, H.

Any means of performing updating of check edge messages can be employed, including the Gallager function that employs tanh(x) and $\tanh^{-1}(x)$ functions, min processing, min-sum processing, min* (min-star) processing, min** (min-double-star) processing, and many other processing types as well. If is also noted that any desired scaling of the check edge messages and bit edge messages can be performed to accommodate an LDPC matrix, H, whose sub-matrices may have a weight of more than 1.

Using this novel approach of overlapping sub-matrix based LDPC decoding in which the updating of the check edge messages begins well before the updating of the bit edge messages is complete, the memory required to store and pass the check edge messages and the bit edge messages between one or more check engines and one or more bit engines can be reduced significantly, and the number of decoding iterations that can be performed within a given period of time is increased by a factor of 2 (i.e., 2×). This also contributes to a significant amount of energy and power savings without requiring all of the memory access and the ability to converge on a solution much quicker (i.e., double the decoding speed thanks to the gain of 2× the number of decoding iterations). This amount of energy and power savings can be critical in many mobile and/or wireless communication device type applications, in that, energy can be inherently limited (e.g., when energy is supplied from a battery type source).

Moreover, by the very nature of LDPC codes, any amount of desired parallel processing and architecture can also be employed to increase further the data throughput when decoding an LDPC coded signal. For example, multiple sub-matrices can be processed in parallel using multiple check engines and multiple bit engines arranged in a parallel architecture.

If desired an alternative embodiments, the decoding processing can operate to update check edge messages (e.g., using min1 and min2 in a min-sum approach) after updating each column of bit edge messages instead of only updating the check edge messages after the last column has been updated during bit node processing. By using this decoding approach, a solution can be converged upon more quickly thereby reducing a required number of decoding iterations.

Figure 2:
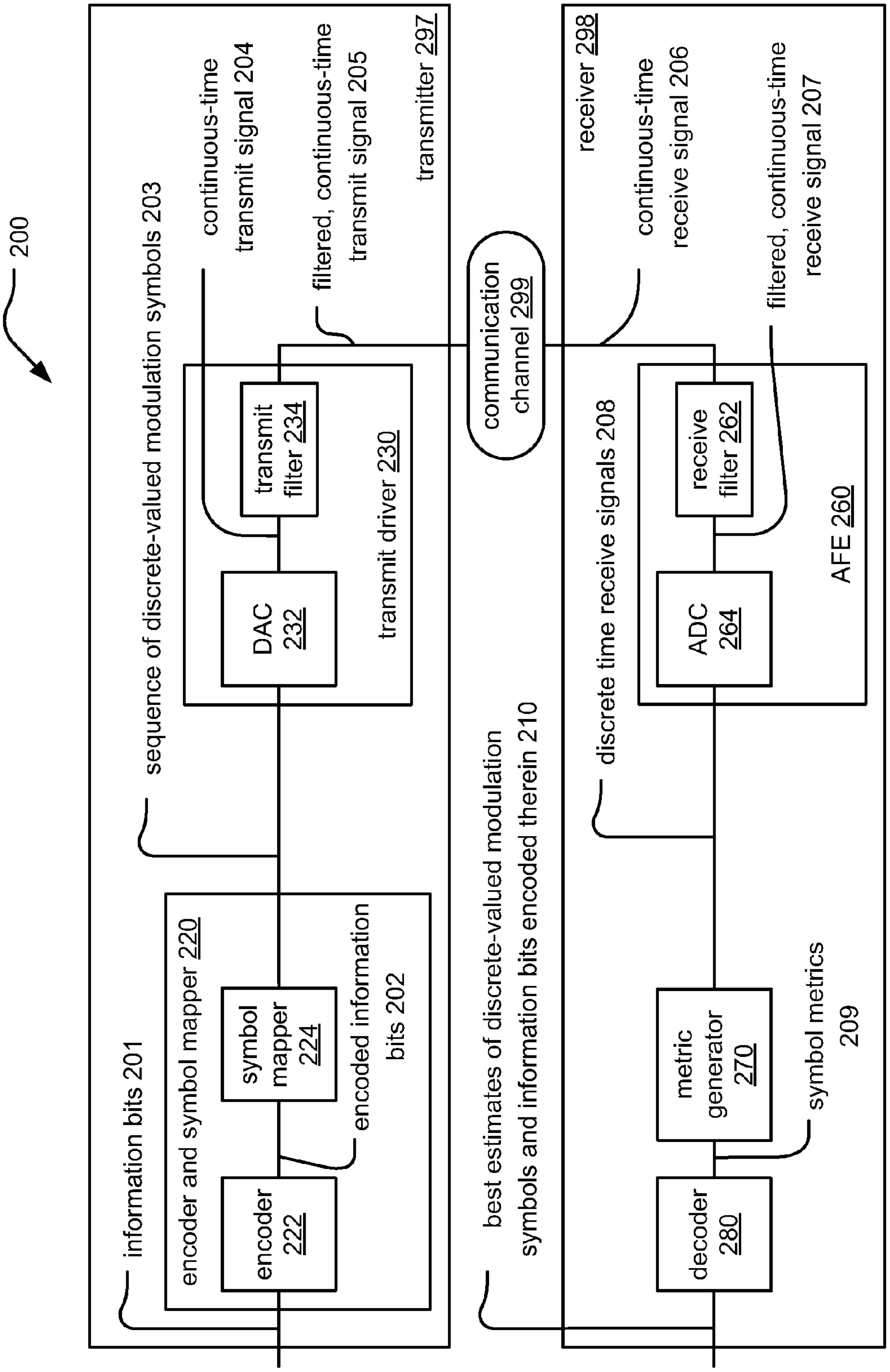

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signals. Before more details are provided below, a general description of LDPC codes is provided.

Figure 3:
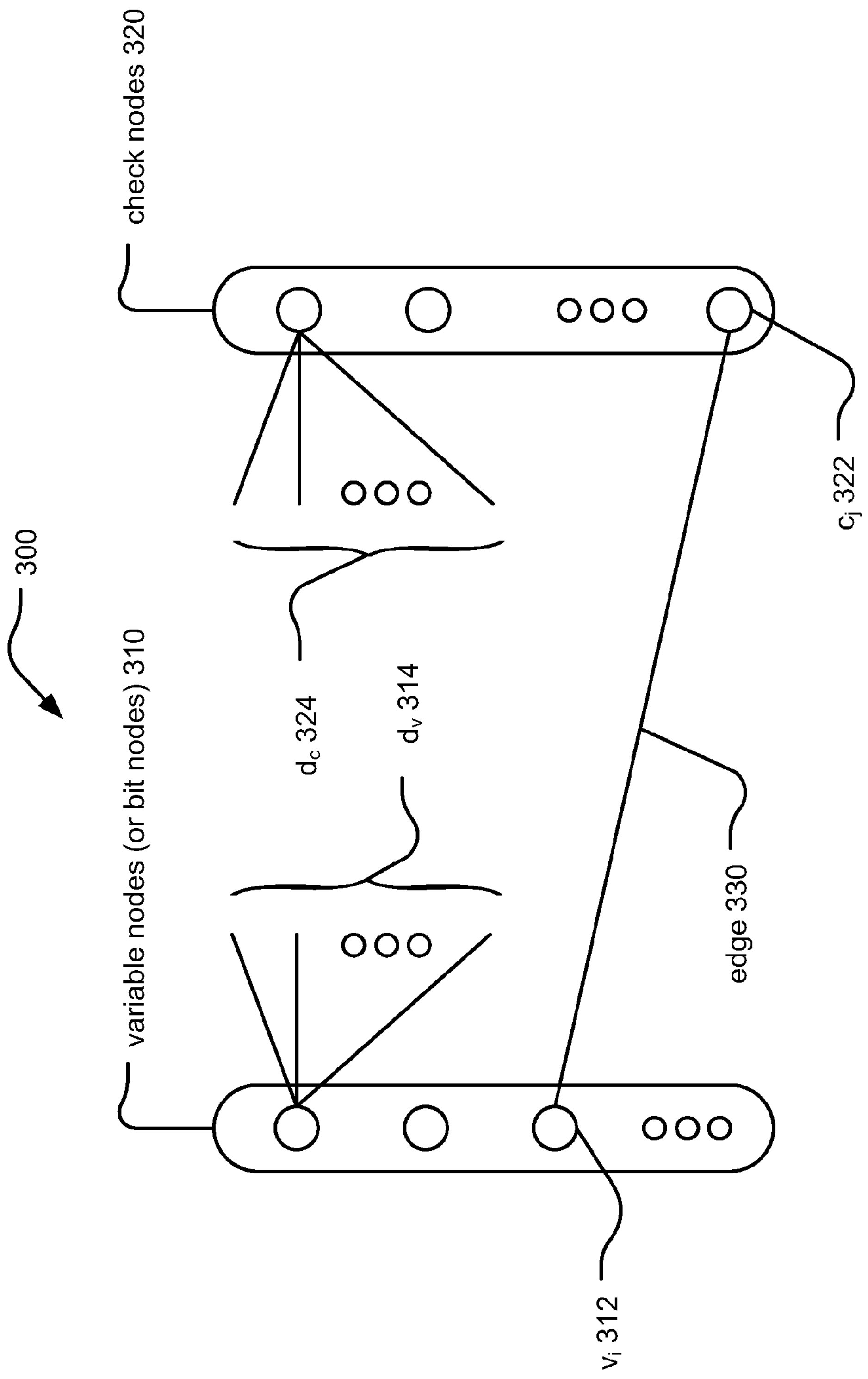
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h)_{i,j})_{M\times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29th Symp. on Theory of Computing,* 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i,j). However, on the other hand, given an edge e=(i,j), the nodes of the edge may alternatively be denoted as by e=(v(e),c(e)) (or e=(b(e), c(e))).

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

Figure 4:
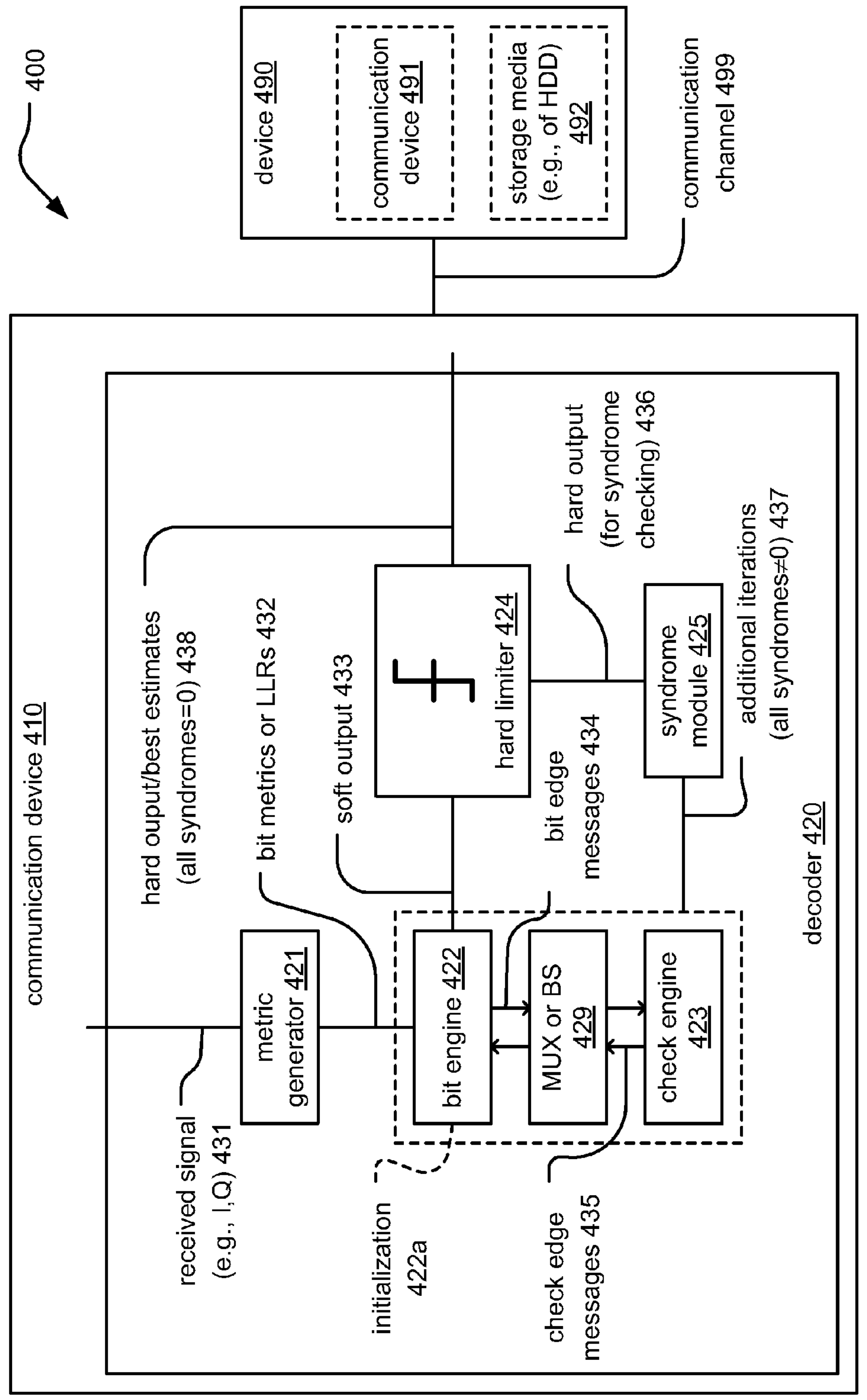
FIG. 4 illustrates another embodiment of a communication system.

FIG. 4 illustrates another embodiment of a communication system 400. The communication system 400 includes a communication device 410. The communication device 410 includes a decoder 420 that is operable to overlapping sub-matrix based decoding of an LDPC coded signal.

A signal is received by the communication device 410 from a communication channel 490 that can be coupled to another device 490, which may be another communication device 491, a storage media (e.g., such as that within an hard disk drive (HDD) application), or any other device as well. Generally, the communication device 410 can be implemented to receive a signal from any other device that provides an LDPC coded signal thereto.

The signal received from the communication channel 499 is an LDPC coded signal, and it can have any of a variety of types of modulation including BPSK, QPSK, 8 PSK, 16 QAM, 32 QAM, 64 QAM, and even other types of modulation as well. After undergoing any appropriate pre-processing (e.g., such as demodulation, frequency up or down conversion, digital sampling, filtering, or any other appropriate type of pre-processing including that which may be performed in an analog front end (AFE) of the communication device 410), a digital version of the received signal, shown now as reference numeral 431 that can include the in-phase and Quadrature (I, Q) components of the signal (such as in a baseband signal) is received by the decoder 420.

The received signal 431 is provided to a metric generator 421. The metric generator 421 can calculate symbol metrics (e.g., in the context of when a higher order modulation signal is employed) and then calculate bit metrics or LLRs (log likelihood ratios) there from, as shown by reference numeral 432. For example, when a higher order modulation signal is used, the symbol metrics are calculated for each received symbol in view of the constellation shape and mapping employed. Then, these symbol metrics can be decomposed into bit metrics for the individual bits of the symbols.

These bit metrics or LLRs 432 are then passed to a bit engine 422 for use in firstly performing initialization, as shown by reference numeral 422*a*. During the initialization 422*a*, the bit metrics or LLRs 432 themselves are employed to initialize the bit edge messages within the bit engine 422. Thereafter, these initialized bit edge messages 434 are passed via a multiplexor (MUX) or BS (Barrel Shifter) 429 to a check engine 423 to perform updating of check edge messages (e.g., check node processing) and the updated check edge messages 435 are then passed back via the MUX or BS 429 to the bit engine 422 to continue the iterative decoding processing. For appropriate re-alignment of either the bit edge messages or the check edge messages when the LDPC matrix, H, has a randomly permuted format, a MUX can be employed. Alternatively, if the LDPC matrix, H, has a format of a CSI (Cyclic Shifted Identity) matrix, then a BS can be employed within the module indicated by reference numeral 429. The bit edge messages 434 and the check edge messages 435 are successively and alternatively updated using the bit engine 422 and the check engine 435 during the iterative decoding processing.

During each or selected decoding iterations, soft output 433 is generated by the bit engine 422 using the most recently updated check edge messages 435 as well as the bit metrics or LLRs 432 themselves, and this soft output 433 is passed to a hard limiter 424 that generates hard output/best estimates 438 to determine whether all syndromes of the LDPC code are equal to zero or not, as determined by a syndrome module 425. The hard output 436 is provided to the syndrome module 425 to make this determination. If all of the syndromes of the LDPC code are equal to zero (i.e., a valid codeword has been converged upon), then the hard output/best estimates 438 can be output from the decoder 420. Alternatively, if all of the syndromes of the LDPC code are not equal to zero, then additional decoding iterations can be performed using the bit engine 422 and the check engine 423. Alternatively, simply a fixed number of decoding iterations can be performed, and then the hard output/best estimates 438 generated using that number of decoding iterations can be output from the decoder 420 without needing to check the syndromes.

There are a variety of means in which the updating to generate the check edge messages 435 can be performed including Gallager function that employs tanh(x) and $\tanh^{-1}(x)$ functions, min processing, min-sum processing, min* (min-star) processing, min** (min-double-star) processing, and many other processing types as well.

One means by which LDPC decoding can be performed is described in the following reference [4]:

[4] Juntan Zhang, Marc Fossorier, Daqing Gu, and Jinjun Zhang, "Improved Min-Sum Decoding of LDPC Codes Using 2-Dimensional Normalization", *IEEE Global Telecommunications Conference* (*GLOBECOM*), Vol. 3, pp. 1187-1192, November 2005.

The standard LLR (log likelihood ratio) BP (belief propagation) LDPC decoding approach is carried out as described in the reference [4]:

II. Standard BP

Suppose a regular binary (N,K)(dv,dc) LDPC code C is used for error control over an AWGN (additive white Gaussian noise) channel zero mean and power spectral density $N_0/2$. Assume BPSK signaling with unit energy, which maps a codeword $w=(w_1, w_2, \ldots, w_N)$ into a transmitted sequence $q=(q_1, q_2, \ldots, q_N)$, according to $q_n=1-2w_n$, for n=1, 2, . . . , N. If $w=[w_n]$ is a codeword in C and $q=[q_n]$ is the corresponding transmitted sequence, then the received sequence is $q+g=y=[y_n]$, with $y_n=q_n+g_n$, where for $1 \leqq n \leqq N$, $g_n$'s are statistically independent Gaussian random variables with zero mean and variance $N_0/2$. Let $H=[H_{mn}]$ be the parity check matrix which defines the LDPC code. We denote the set of bits that participate in check m by $\mathcal{N}(m)=\{n:Hmn=1\}$ and the set of checks in which bit n participates as $\mathcal{M}(m)=\{m:Hmn=1\}$. We also denote $\mathcal{N}(m)\backslash n$ as the set $\mathcal{N}(m)$ with bit n excluded, and $\mathcal{M}(m)\backslash n$ as the set $\mathcal{M}(m)$ with check m excluded. We define the following notations associated with i-th iteration:

$U_{ch,n}$: The log-likelihood ratios (LLR) of bit n which is derived from the channel output $y_n$. In BP decoding, we initially set $$U_{ch,n} = \frac{4}{N_0} y_n.$$

$U_{mn}^{(i)}$: The LLR of bit n which is sent from check node m to bit node n.

$V_{mn}^{(i)}$: The LLR of bit n which is sent from the bit node n to check node m.

$V_n^{(i)}$: The a posteriori LLR of bit n computed at each iteration.

The standard LLR BP algorithm is carried out as follows [3]:

Initialization, set i=1, maximum number of iteration to $I_{max}$. For each m,n, set $V_{m,n}^{(0)}=U_{ch,n}$.

Step 1:

(i) Horizontal step, for $1 \leqq n \leqq N$ and each $m \in \mathcal{M}(n)$, process:

$$U_{mn}^{(i)} = 2\tanh^{-1} \prod_{n' \in N(m) \setminus n} \tanh \frac{V_{mn'}^{(i-1)}}{2} \quad (1)$$

(ii) Vertical step, for $1 \leqq n \leqq N$ and each $m \in \mathcal{M}(n)$, process:

$$V_{mn}^{(i)} = U_{ch,n} + \sum_{m' \in M(m) \setminus n} U_{m'n}^{(i)} \quad (2)$$

$$V_n^{(i)} = U_{ch,n} + \sum_{m \in M(m)} U_{mn}^{(i)}$$

Step 2: Hard decision and stopping criterion test:

(i) Create $\hat{w}^{(i)}=[\hat{w}_n^{(i)}]$ such that $\hat{w}_n^{(i)}=1$ if $V_n^{(i)}<0$, and $\hat{w}_n^{(i)}=0$ if $V_n^{(i)} \geqq 0$.

(ii) If $H\hat{w}^{(i)}=0$ or the maximum iteration number $I_{Max}$ is reached, stop the decoding iteration and go to Step 3. Otherwise set i:=i+1 and go to Step 1.

Step 3: Output $\hat{w}^{(i)}$ as the decoded codeword." (reference [4], Zhang et al., pp. 1187-1188)

It is noted that the "Horizontal Step" as described in Step 1 above in reference [4] can alternatively be referred to as check node processing which can be performed using a variety of means including min* (min-star) processing, min (min-double-star) processing, or any other appropriate means. In accordance with check node processing, it is noted that min processing is the true mathematical representation of the tanh and $\tanh^{-1}$ calculation in equation (1) above. Some details regarding the min* processing and min** processing are provided below.

For any real values x and y, we can define the calculation of min* as described below. The min* calculation includes finding an actual minimum and also a natural log base e ($\log_e = \ln$) correction factor that will be referred to as "ln" hereinafter.

$$\min{}^*(x,y) = -\ln(e^{-x}+e^{-y}) \quad \text{(EQ m1)}$$

In general, we define $\min{}^*(x_1, \ldots, x_N) = \min{}^*(\min{}^*(x_1, \ldots, x_{N-1}), x_N)$. Using induction, one can prove the following:

$$\min{}^*(x_1, \ldots, x_N) = -\ln(e^{-x_1} + e^{-x_N}).$$

From (EQ m1), we have the following:

$$\min*(x, y) = \begin{cases} x - \ln(1 + e^{x-y}), & x \le y \\ y - \ln(1 + e^{x-y}), & x > y \end{cases} = \min(x, y) - \ln(1 + e^{-|x-y|}) \quad \text{(EQ m2)}$$

The min** processing operation, when processing inputs A and B, is provided as follows:

$$\min**(A, B) = \ln\left(\frac{1 + e^{(A+B)}}{e^A + e^B}\right) \quad \text{(EQ m3)}$$

$$\min**(A, B) = \min(A, B) - \ln(1 + e^{-|A-B|}) + \ln(1 + e^{-(A+B)}) \quad \text{(EQ m4)}$$

For each of these min* and min** processing operation, there are also analogous max* and max** processing operations as well.

Looking more specifically at equation (1), for each check edge message connecting to a particular check node, this check node processing involves generating the product of all of the inputs (e.g., edge messages corresponding to the edges that connect to that particular check node) except for that particular edge message that is undergoing check node processing.

The "Vertical Step" as described above in Step 1 above in reference [4] can alternatively be referred to as bit node processing. Looking at equation (2), for each bit edge message connecting to a particular bit node, this bit node processing involves, in part, generating the sum of all of the inputs (e.g., edge messages corresponding to the edges that connect to that particular bit node) except for that particular edge message that is undergoing bit node processing.

In addition, some of the variables employed in the description cited above can also be referred to as follows:

$U_{ch,n}$: may also be referred to as the bit metrics or LLRs.

$U_{mn}^{(i)}$: may also be referred to as the check edge messages.

$V_{mn}^{(i)}$: may also be referred to as the bit edge messages.

$V_n^{(i)}$: may also be referred to as the soft output.

The initialization as described above in reference [4] can viewed as setting the bit metric values (e.g., $U_{ch,n}$) to be the initial value of all of the bit edge messages (e.g., $V_{m,n}^{(0)}=U_{ch,n}$).

The "Hard decision and stopping criterion test" as described above in Step 2 above in reference [4] can alternatively be referred to as the syndrome calculation, such as can be performed within a syndrome module.

There are other means by which an LDPC coded signal can be decoded besides the BP decoding approach. Another approach, the MS (min-sum) decoding approach is also described in the reference [4].

III. MS Decoding

The check node processing in the standard BP decoding may require considerable computational resource and may cause hardware implementation difficulties as well as high decoding delay. BP decoding can be simplified by approximating the calculation at the check nodes with a simple minimum operation, which results in MS decoding [6], [7].

A. MS Algorithm

In MS decoding, the bit node operation is the same as in the standard BP. Taking advantage of the odd property of the function tanh( ) MS simplifies the updating rule in check nodes by modifying (1) into $$U_{mn}^{(i)} = \prod_{n' \in \mathcal{N}(m) \backslash n} \text{sgn}(V_{mn'}^{(i-1)}) \cdot \min_{n' \in \mathcal{N}(m) \backslash n} |V_{mn'}^{(i-1)}| \quad (3)$$

The MS algorithm is much simpler than the BP decoding, since only comparisons and additions are needed in check and bit node processing. The product of the signs in (3) can be easily calculated by modulo 2 addition of the hard decision of all $\{V_{mn'}^{(i-1)}: n' \in \mathcal{N}(m) \backslash n\}$. The minimum magnitude can be found by comparison." (reference [4], Zhang et al., p. 1188)

FIG. 5A, FIG. 5B, FIG. 6A, FIG. 6B, FIG. 7A, FIG. 7B, FIG. 8A, and FIG. 8B illustrate an embodiment of overlapping sub-matrix based decoding for an LDPC coded signal whose LDPC matrix, H, has m rows of sub-matrices and n columns of sub-matrices.

The LDPC matrix, H, includes a plurality of sub-matrices arranged in m rows of sub-matrices and n columns of sub-matrices. If desired, each of the sub-matrices can have a common size, such that each sub-matrix is an x×x sub-matrix, so that the total number of rows of the LDPC matrix, H, is m×x, and the total number of columns of the LDPC matrix, H, is n×x (e.g., the LDPC block size includes n×x information bits).

Figure 5A:
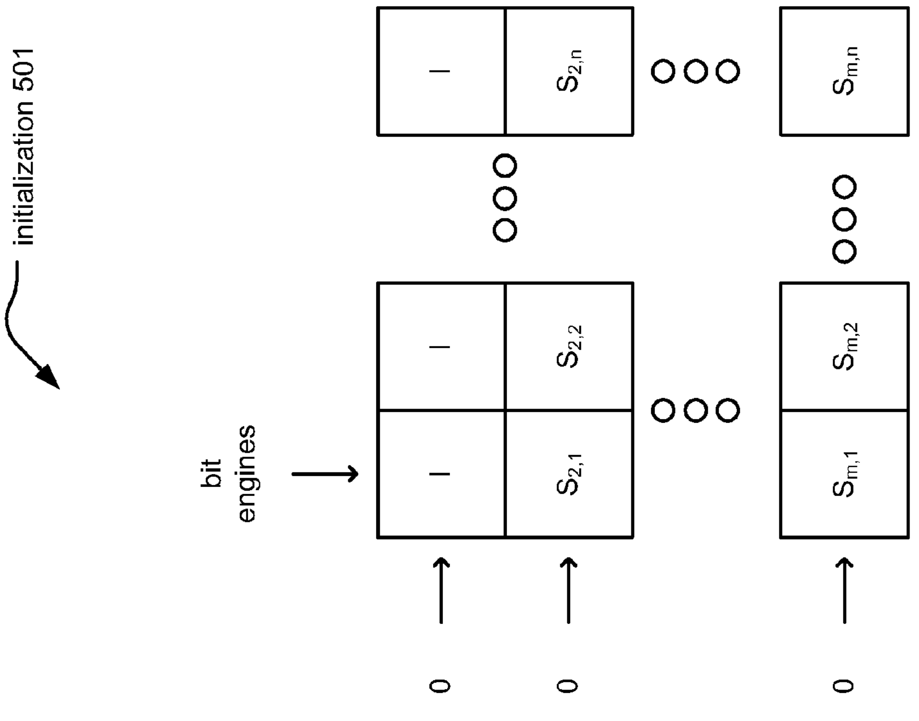
FIG. 5A, FIG. 5B, FIG. 6A, FIG. 6B, FIG. 7A, FIG. 7B, FIG. 8A, and FIG. 8B illustrate an embodiment of overlapping sub-matrix based decoding for an LDPC coded signal whose LDPC matrix, H, has m rows of sub-matrices and n columns of sub-matrices.

Referring to FIG. 5A in which initialization 501 of the first column of sub-matrices of the LDPC matrix, H, is performed, it can be seen that the bit edge messages for each sub-matrix within the first column of the LDPC matrix, H, are initialized using the corresponding, calculated bit metrics of a received signal for the sub-matrices of that column. The check edge messages are all initialized to be 0 as well for these sub-matrices. In this as well as in other embodiments, the check edge messages could alternatively be initialized to another value besides 0 without departing from the scope and spirit of the invention.

Figure 5B:
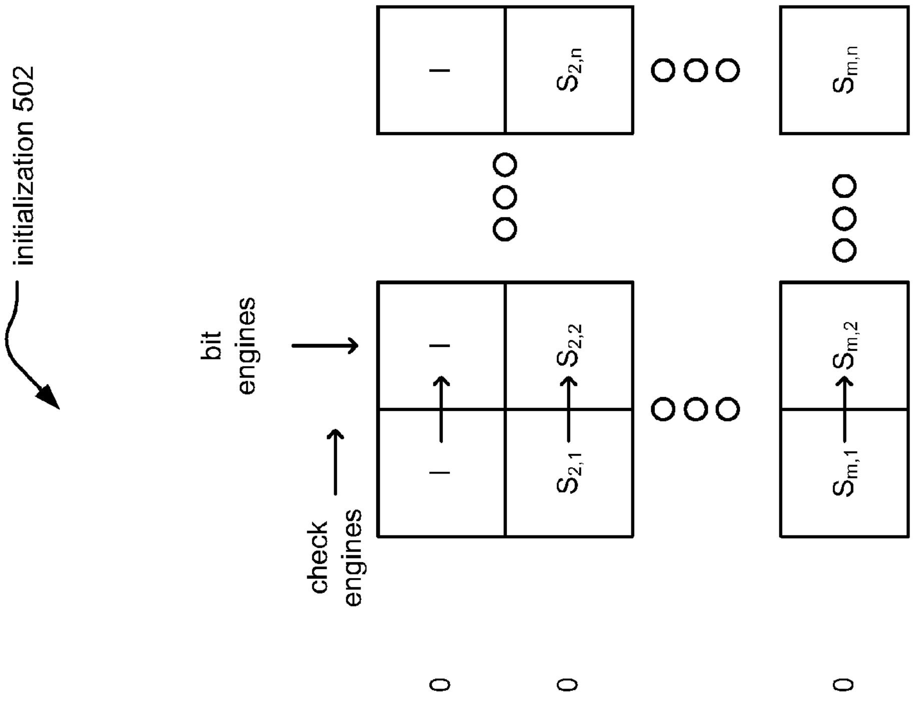

Referring to FIG. 5B in which initialization 502 of the second column of sub-matrices of the LDPC matrix, H, is performed, it can be seen that the bit edge messages for each sub-matrix within the second column of the LDPC matrix, H, are also initialized using the corresponding, calculated bit metrics of a received signal for the sub-matrices of that column. Also, the check nodes of the sub-matrices of the first column of the LDPC matrix, H, are now processed using the just initialized bit edge messages as performed in FIG. 5A.

As can be seen, immediately after the bit edge messages for a sub-matrix are available, then the processing of the check nodes for that sub-matrix can begin. There is no need to wait until all of the bit edge messages for the entire LDPC matrix, H, are available before beginning the processing of the nodes for the entire LDPC matrix, H. Because of the overlapping sub-matrix based processing of the LDPC coded signal, a significant increase in decoding speed can be achieved. In addition, because of this novel approach, in that the just previously updated bit edge messages are employed directly for processing the check nodes, there is virtually no message passing memory storage requirement. When using the min-sum processing approach of updating check edge messages, it is described below how a very small amount of memory is required to store only 3 values (i.e., min1, min2, and an index value) as opposed to all of the check edge messages associated with each check node.

Figure 6A:
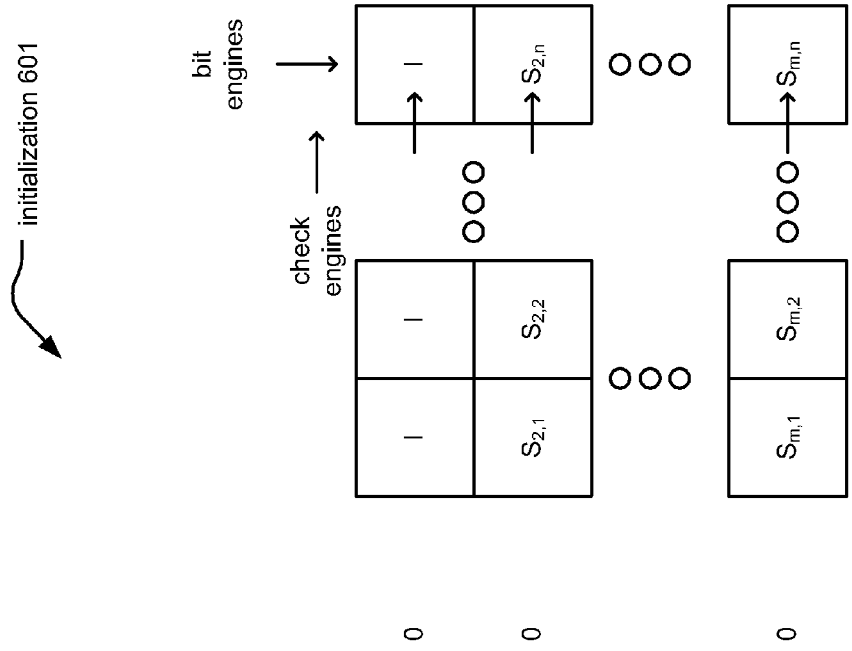

Referring to FIG. 6A in which initialization 601 of the last column of sub-matrices of the LDPC matrix, H, is performed, it can be seen that the bit edge messages for each sub-matrix within the last column of the LDPC matrix, H, are also initialized using the corresponding, calculated bit metrics of a received signal for the sub-matrices of that column. Also, the check nodes of the sub-matrices situated just to the left of the last column of the LDPC matrix, H, are now processed using the just previously initialized bit edge messages for those sub-matrices.

Figure 6B:
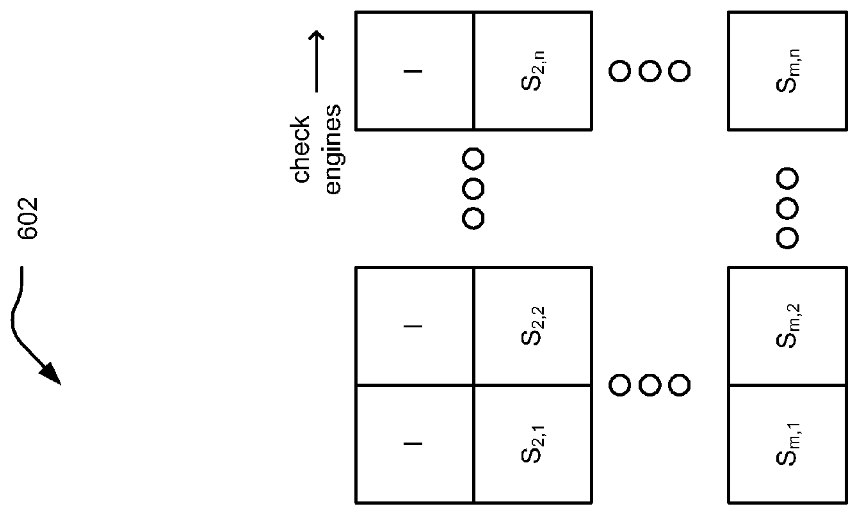

Referring to FIG. 6B, as shown by the reference numeral 602, processing of the check nodes of the sub-matrices within the last column of sub-matrices of the LDPC matrix, H, is performed using the just previously updated bit edge messages as performed within the FIG. 6A. At this time, all of the bit edge messages for the entire LDPC matrix, H, have already been processed by the check engines. Therefore, the check edge messages can now be updated for use in the next decoding iteration.

Now, once the check edge messages for each sub-matrix of each rows of sub-matrices of the LDPC matrix, H, have been updated using the initial values of the bit edge messages, then some optimization can be performed when using min-sum processing within the updating of the check edge messages (i.e., within the check node processing). When using min-sum processing, only the true minimum value (min1) and a second most minimum value (min2) of a plurality of inputs needs to be tracked, as well as an index indicating which of these input values is in fact the true minimum value (or the second most minimum value). This index is used later, during check edge message updating, when selecting the appropriate output check edge message as being min1 or min2. This can result in a massive savings of memory, in that, only 3 values need to be stored (i.e., min1, min2, and an index value) as opposed to all of the check edge messages associated with each check node.

After the initialization of each of the bit edge messages for each sub-matrix of the LDPC matrix, H, has been performed, and after the updating of the check edge messages for those sub-matrices is available, then the min1 and min2 values may be employed for performing subsequent updating of the check edge messages such as during the first and subsequent decoding iterations.

Figure 7B:
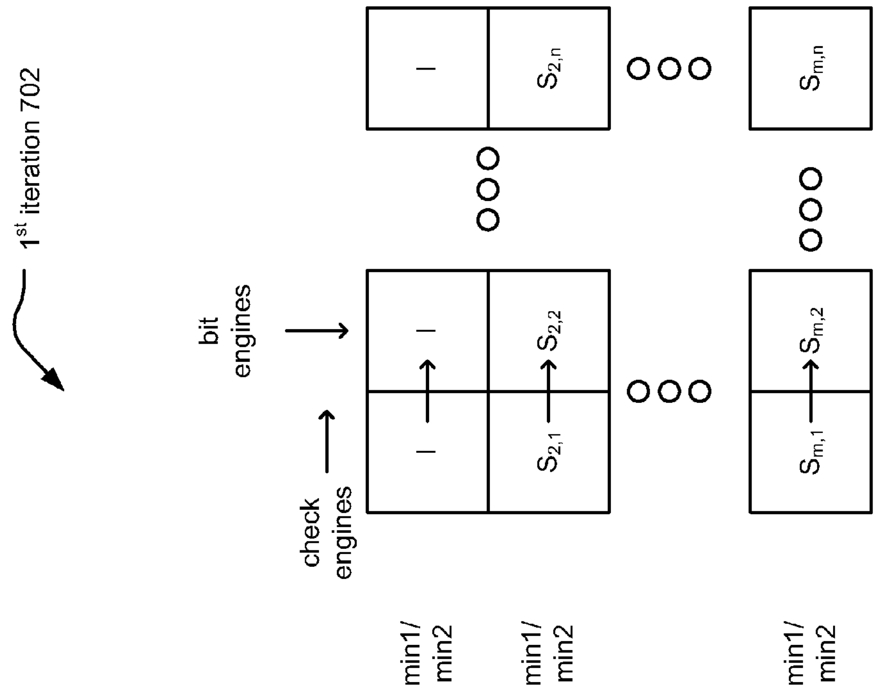
Figure 7A:
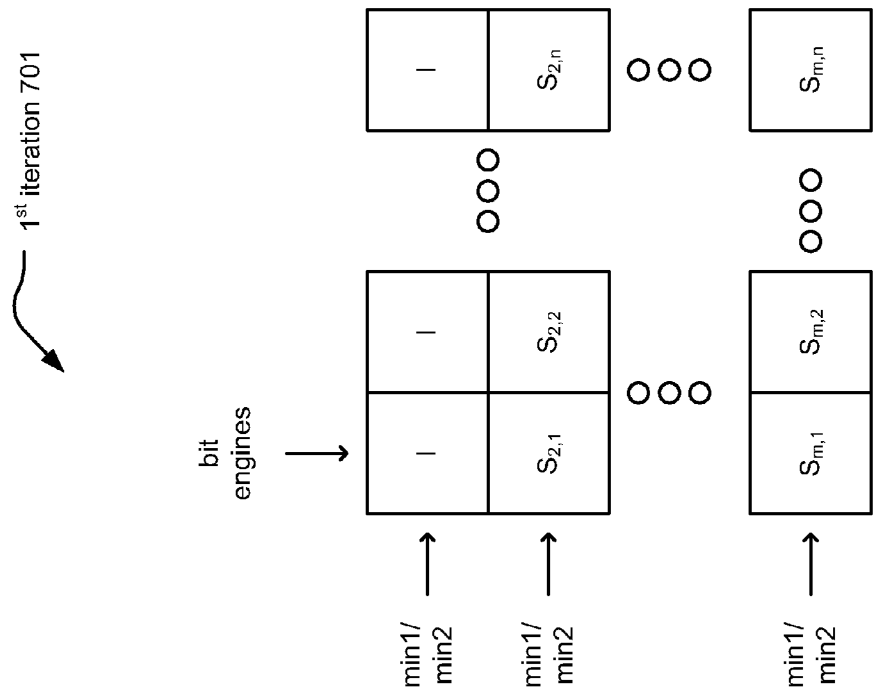

Referring to FIG. 7A in which a first decoding iteration 701 of the first column of sub-matrices of the LDPC matrix, H, is performed, it can be seen that the bit edge messages for each sub-matrix within the first column of the LDPC matrix, H, are updated using the check edge message min1 or min2. When updating the bit edge message for any bit node, either min1 or min2 is selected. When a previous iteration's bit edge message (or the initialized bit edge messages in the case of the first iteration) is the minimum value of all of the bit edge messages connecting to a check node, then the value min2 is selected for that particular check edge message to be used in updating the bit edge message. Otherwise, the value min1 is selected for that particular check edge message to be used in updating the bit edge message.

Referring to FIG. 7B in which a first decoding iteration 702 of the second column of sub-matrices of the LDPC matrix, H, is performed, it can be seen that the bit edge messages for each sub-matrix within the second column of the LDPC matrix, H, are updated using the check edge message min1 or min2. Similarly as described above, when updating the bit edge messages for any bit node, either min1 or min2 is selected. When the previous iteration's bit edge message (or the initialized bit edge messages in the case of the first iteration) is the minimum value of all of the bit edge messages connecting to a check node, then the value min2 is selected for that particular check edge message to be used in updating the bit edge message. Otherwise, the value min1 is selected for that particular check edge message to be used in updating the bit edge message. At the same time as the updating of the bit edge messages of the sub-matrices within the second column of the LDPC matrix, H, is being performed, the check nodes for each sub-matrix within the first column of the LDPC matrix, H, are processed using the just previously updated bit edge messages as performed within the FIG. 7A.

Again, as can be seen, immediately after the bit edge messages for a sub-matrix are available, then the processing of the check nodes for that sub-matrix can begin. There is no need to wait until all of the bit edge messages for the entire LDPC matrix, H, are available before beginning the processing of all the check nodes for the entire LDPC matrix, H. Because of the overlapping sub-matrix based processing of the LDPC coded signal, a significant increase in decoding speed can be achieved.

Figure 8B:
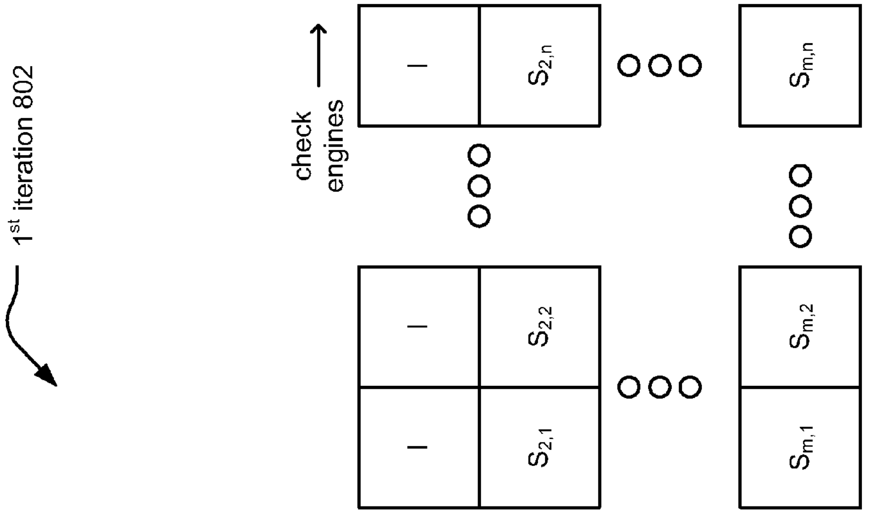
Figure 8A:
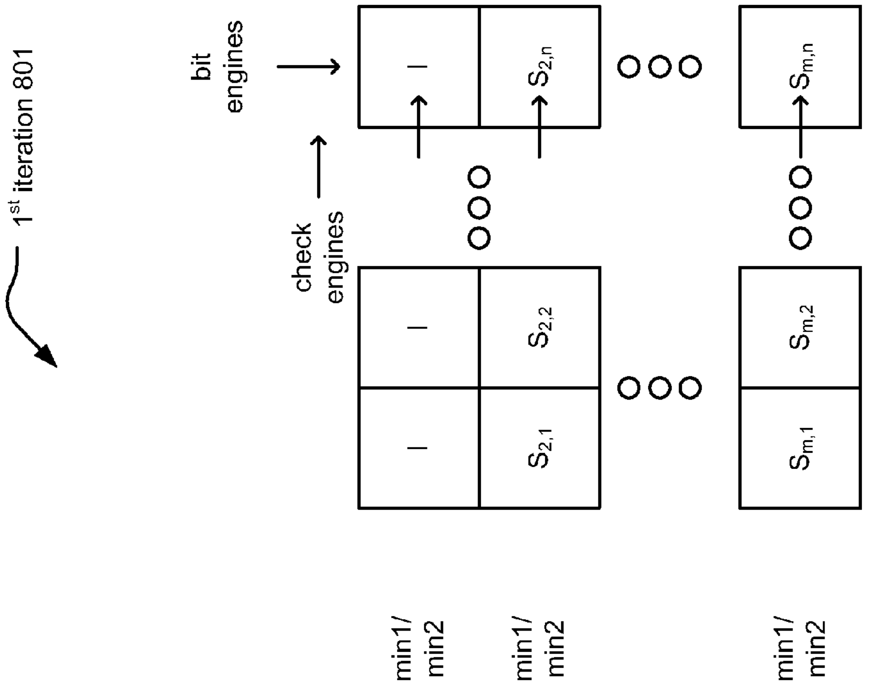

Referring to FIG. 8A in which a first decoding iteration 801 of the last column of sub-matrices of the LDPC matrix, H, is performed, it can be seen that the bit edge messages for each sub-matrix within the last column of the LDPC matrix, H, are updated using the check edge message min1 or min2. At the same time as the updating of the bit edge messages of the sub-matrices within the last column of the LDPC matrix, H, is being performed, the check nodes for each sub-matrix within the second to last column of the LDPC matrix, H, are processed using the just previously updated bit edge messages for those sub-matrices.

Referring to FIG. 8B, as shown by the reference numeral 802, processing of the check nodes of the sub-matrices within the last column of sub-matrices of the LDPC matrix, H, is performed using the just previously updated bit edge messages as performed within the FIG. 8A.

At this time, all of the bit edge messages for the entire LDPC matrix, H, have already been processed by the check engines. Therefore, the check edge messages can now be updated for use in the next decoding iteration (i.e., min1 and min2 are now updated in accordance with the updating of the check edge messages).

As can be seen, the appropriate processing of the sub-matrices of an LDPC matrix, H, allows for overlapping sub-matrix based processing allows for a rapid decoding of an LDPC coded signal thanks to the fact that, for each sub-matrix of the LDPC matrix, H, once the bit edge messages for that sub-matrix have been updated (or initialized during initialization), them the processing of the check nodes for that sub-matrix can begin.

FIG. 9, FIG. 10, FIG. 11, FIG. 12, FIG. 13, FIG. 14, FIG. 15, FIG. 16, and FIG. 17 illustrate an embodiment of overlapping sub-matrix based decoding for an LDPC coded signal whose LDPC matrix, H, having (1) 72×72 sized CSI (Cyclic Shifted Identity) sub-matrices, (2) bit degree of 6,2,1 and check degree of 60,61, and (3) a total number of edges of 26,280. These several diagrams show the application of overlapping sub-matrix based LDPC decoder as applied to an LDPC code having a particular LDPC matrix, H, structure. Each of the sub-matrices of the LDPC matrix, H, depicted by an "X" is an all zero-valued sub-matrix (i.e., all elements therein are zero valued). Each sub-matrix depicted by $S_{a,b}$ (where a and b are integers) is a non-zero valued sub-matrix; each sub-matrix depicted by "I" is also a non-zero valued sub-matrix (i.e., the identify matrix).

In many of the embodiments described herein, certain sub-matrices are depicted as "I" sub-matrices (i.e., identity sub-matrices). However, each occurrence of an identity sub-matrix could alternatively be implemented as a permuted identity sub-matrix as well without departing from the scope and spirit of the invention. In other words, wherever an "I" sub-matrix is depicted, a permuted identity sub-matrix (e.g., $S_{a,b}$ (where a and b are integers)) could be inserted instead.

Figure 9:
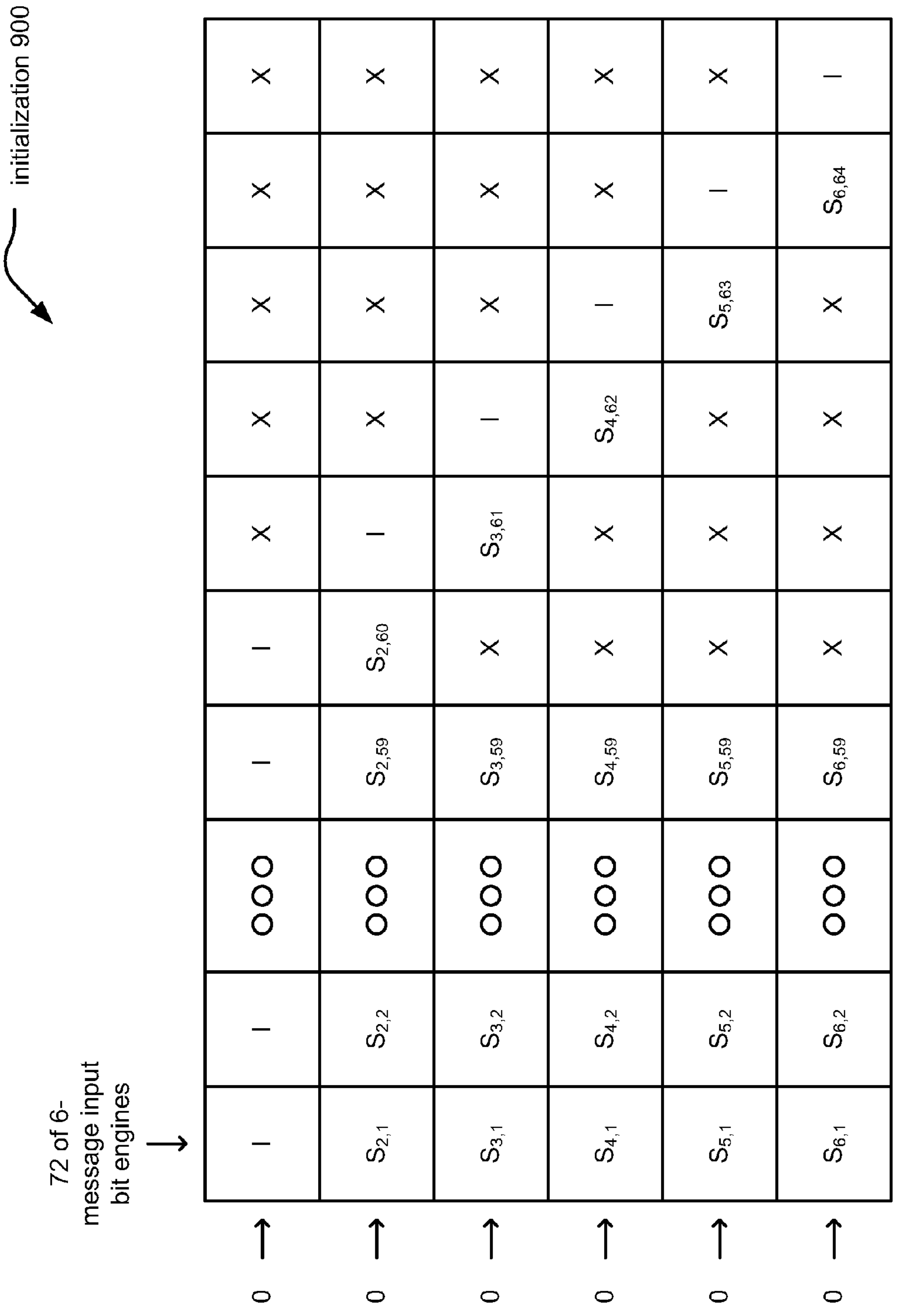

Referring to FIG. 9 in which initialization 900 of the first column of sub-matrices of the LDPC matrix, H, is performed, it can be seen that the bit edge messages for each of the 6 sub-matrices within the first column of the LDPC matrix, H, are initialized using the corresponding, calculated bit metrics of a received signal for that column. The check edge messages are all initialized to be 0 as well for these 6 sub-matrices. In this as well as in other embodiments, the check edge messages could alternatively be initialized to another value besides 0 without departing from the scope and spirit of the invention.

These sub-matrices of the first column are shown as I, $S_{2,1}$, $S_{3,1}$, $S_{4,1}$, $S_{5,1}$, and $S_{6,1}$. The input to the bit engines is 72 of 6-message inputs (e.g., each of the sub-matrices is a 72×72 sized sub-matrix). For each sub-matrix, there are 72 bit engines; each bit engine of these 72 bit engines has 1 bit metric input and 6 check edge message inputs.

Alternatively, an embodiment can employ 72 bit engines with there being 6 message inputs to each bit engine. In such an alternative embodiment, each bit engine could sequentially process each of the 6 message inputs from each of the 6 sub-matrices of a column of the LDPC matrix, H. In this embodiment, it can be seen that there are 72 bit engines (one bit engine for each column of each sub-matrix), and 65 cycles are employed to perform the bit node processing (as there are 65 sub-matrix columns of the entire LDPC matrix, H).

It is also noted that various embodiments can employ varying degrees of parallelism processing, sequential processing, and/or some combination thereof.

Figure 10:
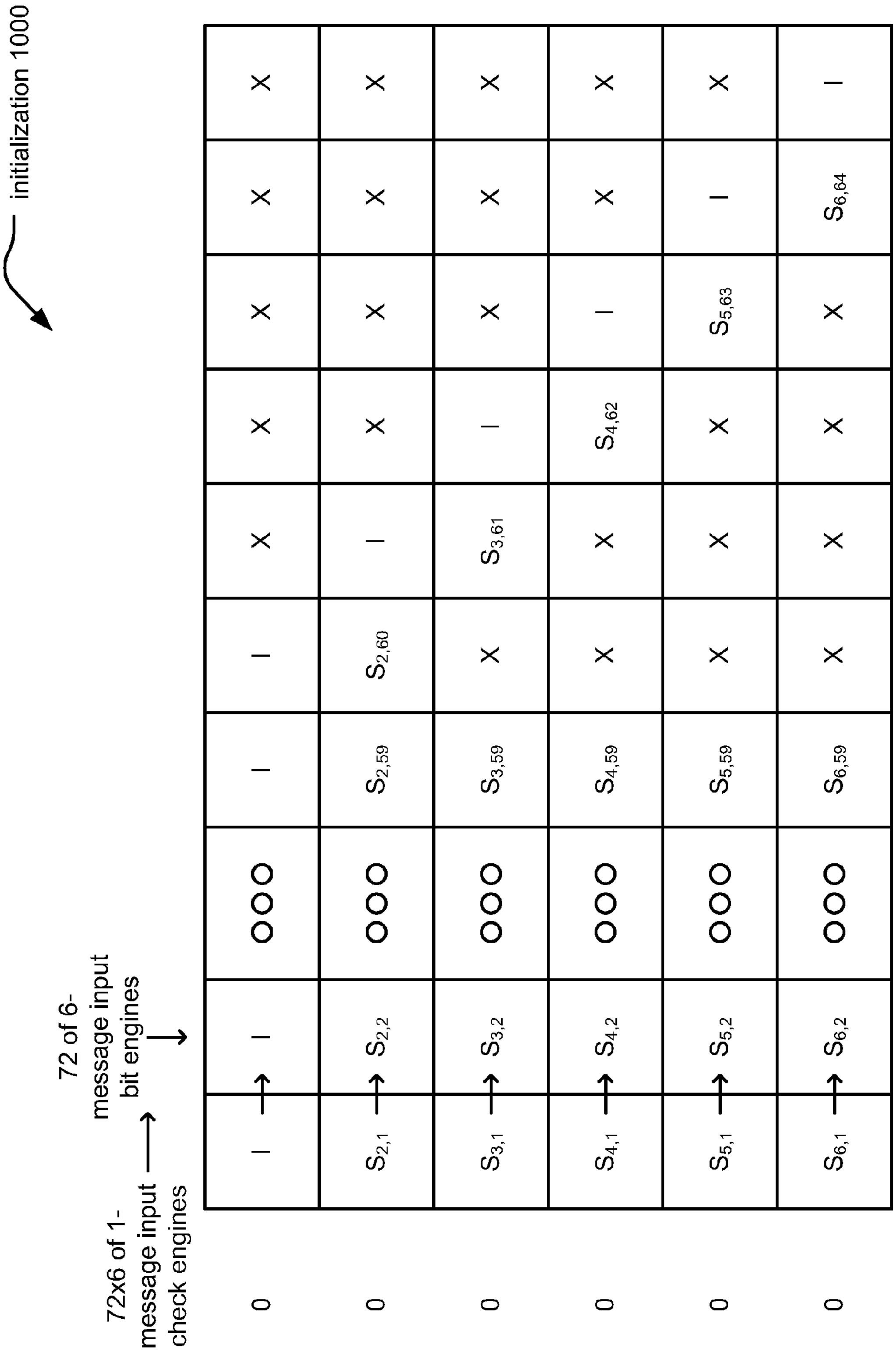

Referring to FIG. 10 in which initialization 1000 of the second column of sub-matrices of the LDPC matrix, H, is performed, it can be seen that the bit edge messages for each of the 6 sub-matrices within the second column of the LDPC matrix, H, are also initialized using the corresponding, calculated bit metrics of a received signal for that column. Also, the check nodes of the sub-matrices of the first column of the LDPC matrix, H, are now processed using the just initialized bit edge messages as performed in FIG. 9.

These 6 sub-matrices of the first column whose check edge messages are being updated are shown as I, $S_{2,1}$, $S_{3,1}$, $S_{4,1}$, $S_{5,1}$, and $S_{6,1}$, and the 6 sub-matrices of the second column whose bit edge messages are being initialized are shown as I, $S_{2,2}$, $S_{3,2}$, $S_{4,2}$, $S_{5,2}$, and $S_{6,2}$. The input to the bit engines is again 72 of 6-message inputs (e.g., each of the sub-matrices is a 72×72 sized sub-matrix), and the input to the check engines is 72×6 of 1-message input. If desired, min-sum processing can also be employed here as described above in other embodiments.

The processing continues successively processing the next column to the right, the next column to the right, and so on, so that the bit edge messages for each column is initialized, and the check nodes for each row are processed base don the initialized bit edge messages.

Figure 11:
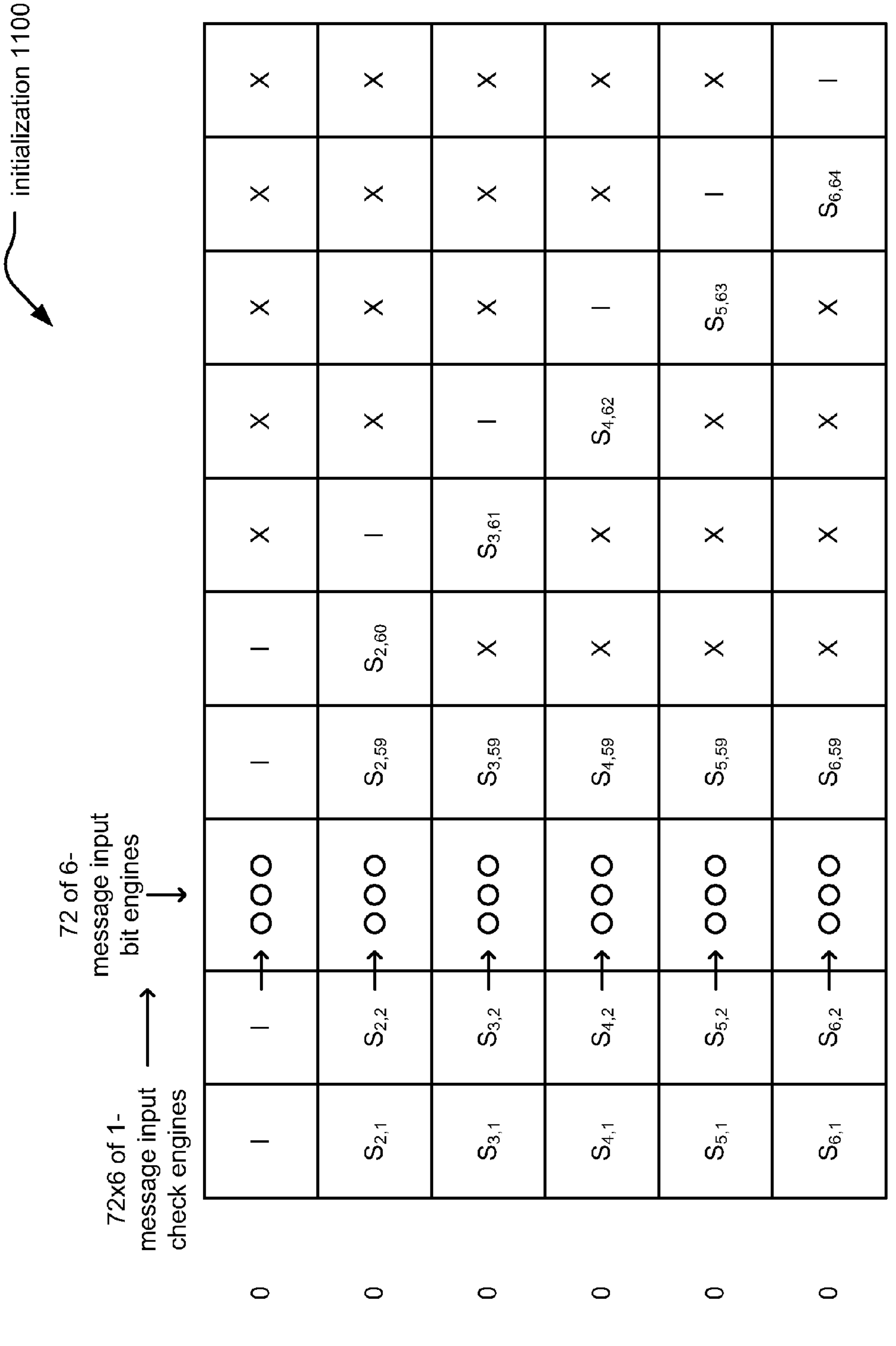

Referring to FIG. 11 in which initialization 1100 of a third column of sub-matrices of the LDPC matrix, H, is performed, it can be seen that the bit edge messages for the third column of the LDPC matrix, H, are initialized using the corresponding, calculated bit metrics of a received signal for that column. Also, the check nodes of the sub-matrices of the second column of the LDPC matrix, H, are now processed using the just initialized bit edge messages as performed in FIG. 10.

Figure 12:
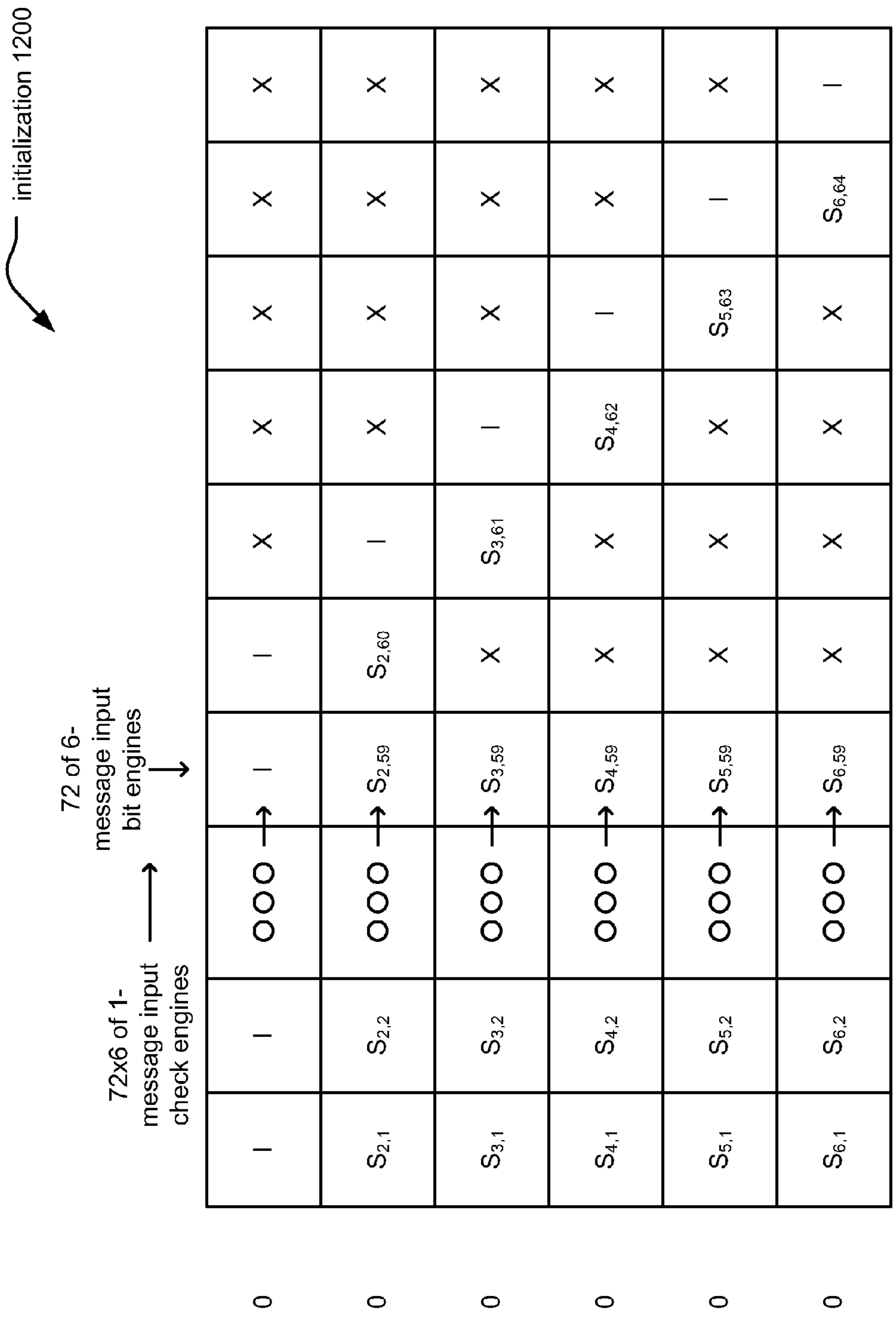

Referring to FIG. 12 in which initialization 1200 of a $59^{th}$ column of sub-matrices of the LDPC matrix, H, is performed, it can be seen that the bit edge messages for the $59^{th}$ column of the LDPC matrix, H, are initialized using the corresponding, calculated bit metrics of a received signal for that column. Also, the check nodes of the sub-matrices of the $58^{th}$ column of the LDPC matrix, H, are now processed using the just previously initialized bit edge messages for the $58^{th}$ column of the LDPC matrix, H.

This processing of initialization continues until the last column of sub-matrices of the LDPC matrix, H, is processed.

Figure 13:
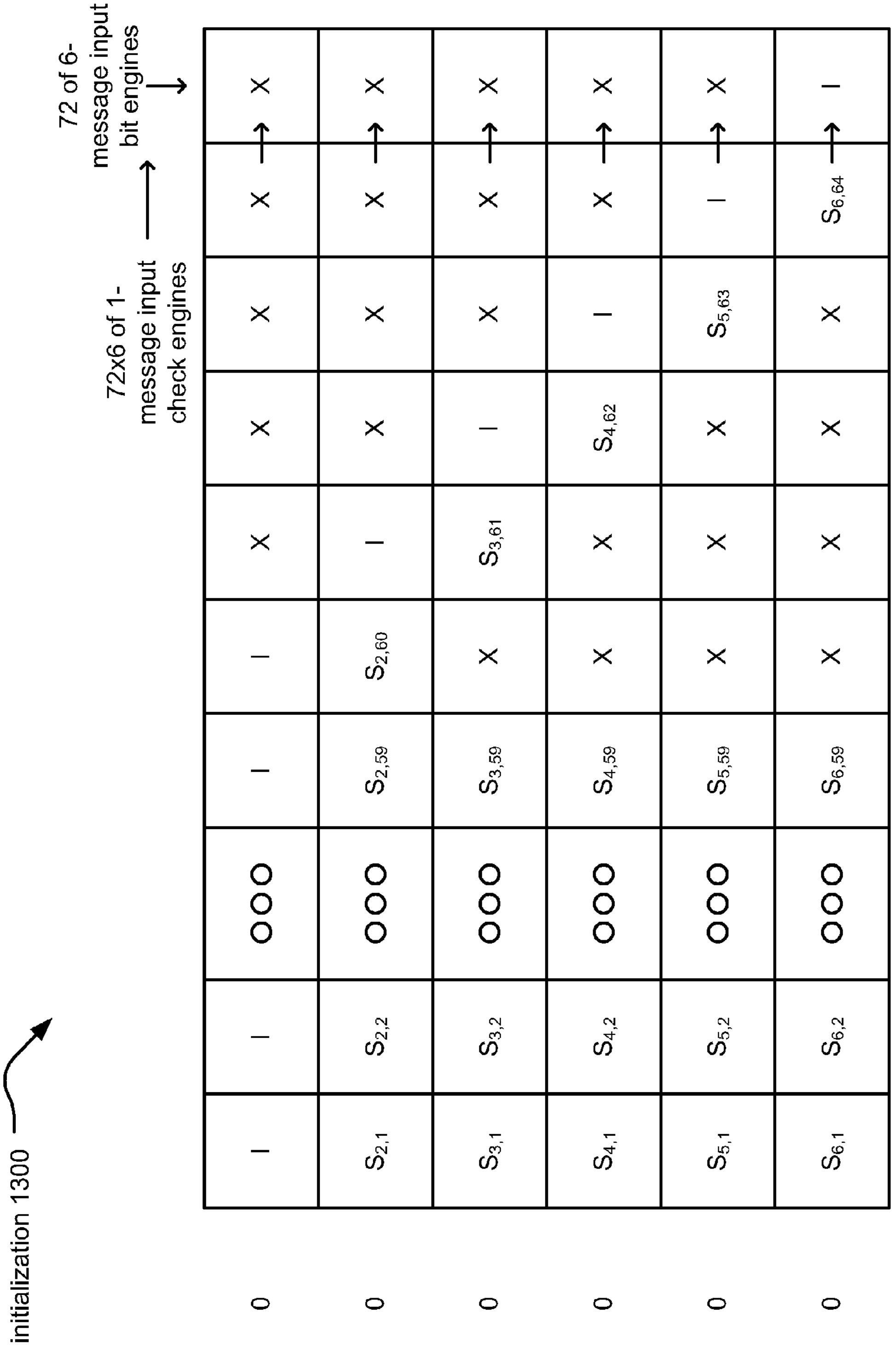

Referring to FIG. 13 in which initialization 1300 of a last/$65^{th}$ column of sub-matrices of the LDPC matrix, H, is performed, it can be seen that the bit edge messages for the last/$65^{th}$ column of the LDPC matrix, H, are initialized using the corresponding, calculated bit metrics of a received signal for that column. Also, the check nodes of the sub-matrices of the second to last/$64^{th}$ column of the LDPC matrix, H, are now processed using the just previously initialized bit edge messages for the sub-matrices of the second to last/$64^{th}$ column of the LDPC matrix, H.

Referring to FIG. 14 and reference numeral 1400, once the bit edge messages of all of the sub-matrices of the last/$65^{th}$ column of sub-matrices of the LDPC matrix, H, have been initialized, then the check nodes for those sub-matrices are processed.

At this time, all of the bit edge messages for the entire LDPC matrix, H, have already been processed by the check engines. Therefore, the check edge messages can now be updated for use in the next decoding iteration.

After all of the bit edge messages of all of the sub-matrices of the LDPC matrix, H, have been initialized, and after all of the check nodes have been processed using the initialized bit edge messages, then a first decoding iteration can begin.

As shown herein, as well as described in other embodiments, when min-sum processing is performed, then only 3 values (i.e., min1, min2, and an index value) as opposed to all of the check edge messages associated with each check node need to be stored. For LDPC codes using relatively larger LDPC code block sizes, this can be a massive savings in memory.

Figure 15:
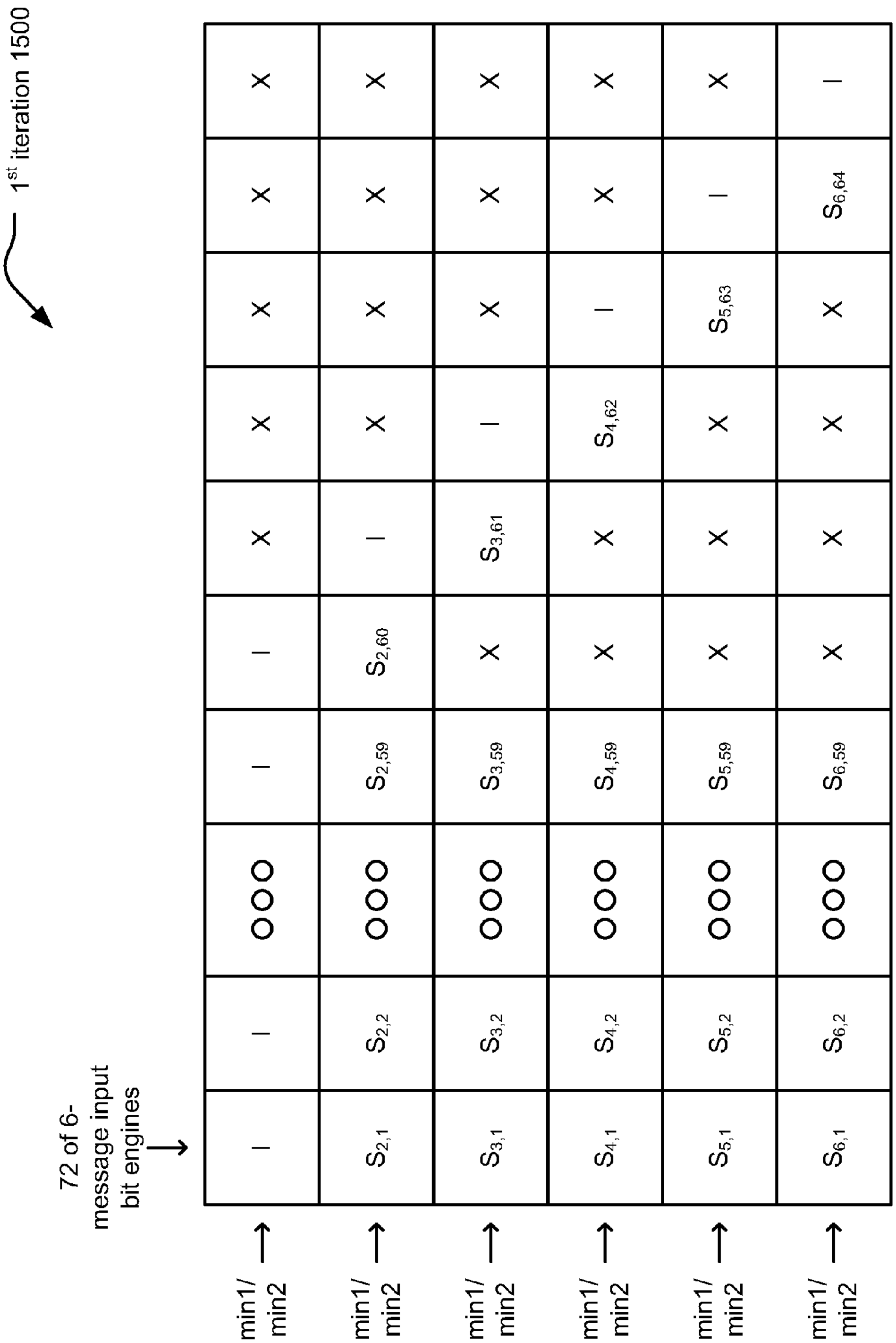

Referring to FIG. 15 in which a first decoding iteration 1500 of the first column of sub-matrices of the LDPC matrix, H, is performed, it can be seen that the bit edge messages for each of the 6 sub-matrices within the first column of the LDPC matrix, H, are updated using the most recently updated check edge messages (i.e., min1 or min2) for those sub-matrices and the calculated bit metric of the received signal for that column.

Figure 16:
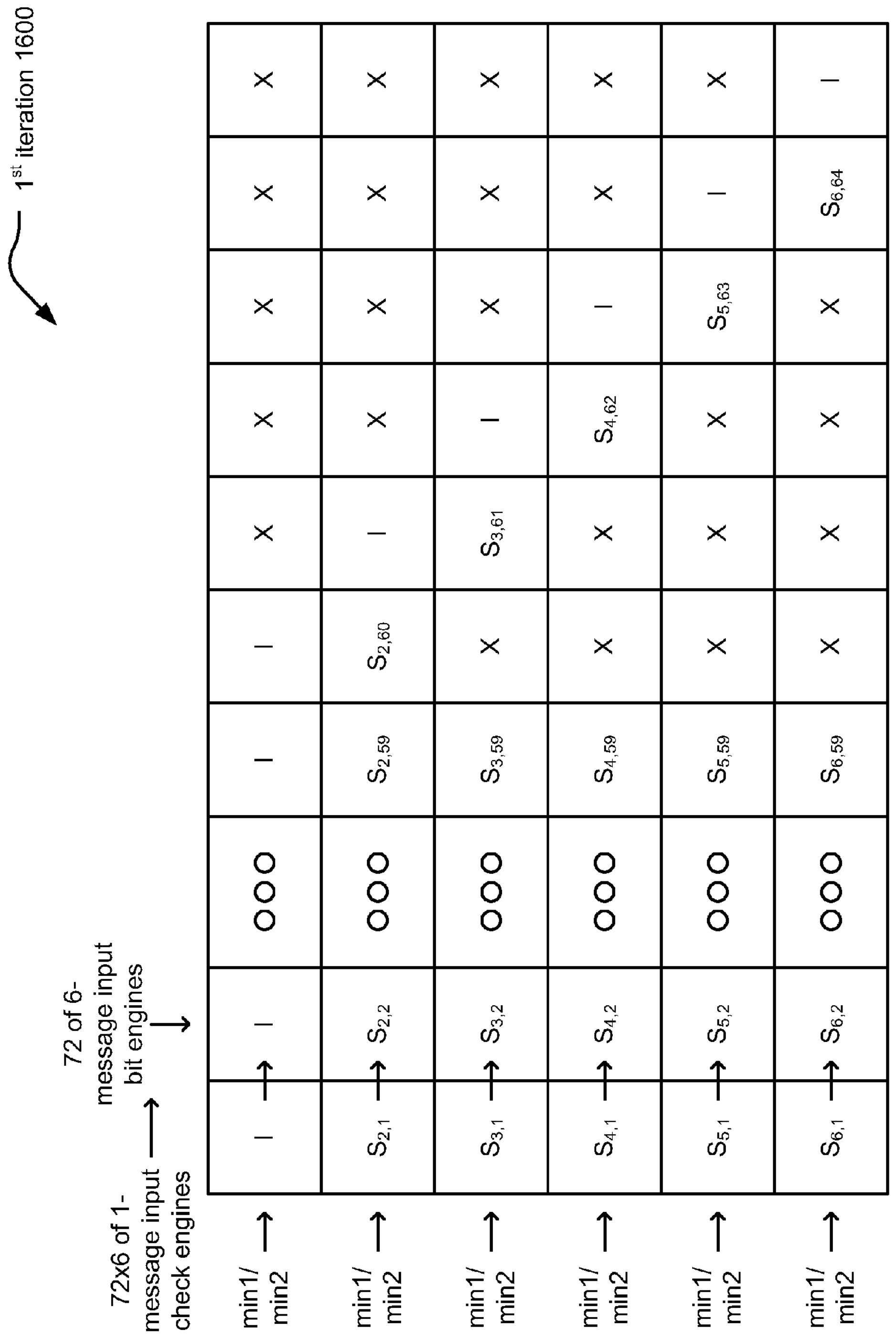

Referring to FIG. 16 in which a first decoding iteration 1600 of the second column of sub-matrices of the LDPC matrix, H, is performed, it can be seen that the bit edge messages for each of the 6 sub-matrices within the second column of the LDPC matrix, H, are updated using the most recently updated check edge messages (i.e., min1 or min2) for those sub-matrices and the calculated bit metric of the received signal for that column. Also, the check nodes of the sub-matrices of the first column of the LDPC matrix, H, are now processed using the just updated bit edge messages as performed in FIG. 15.

Figure 17:
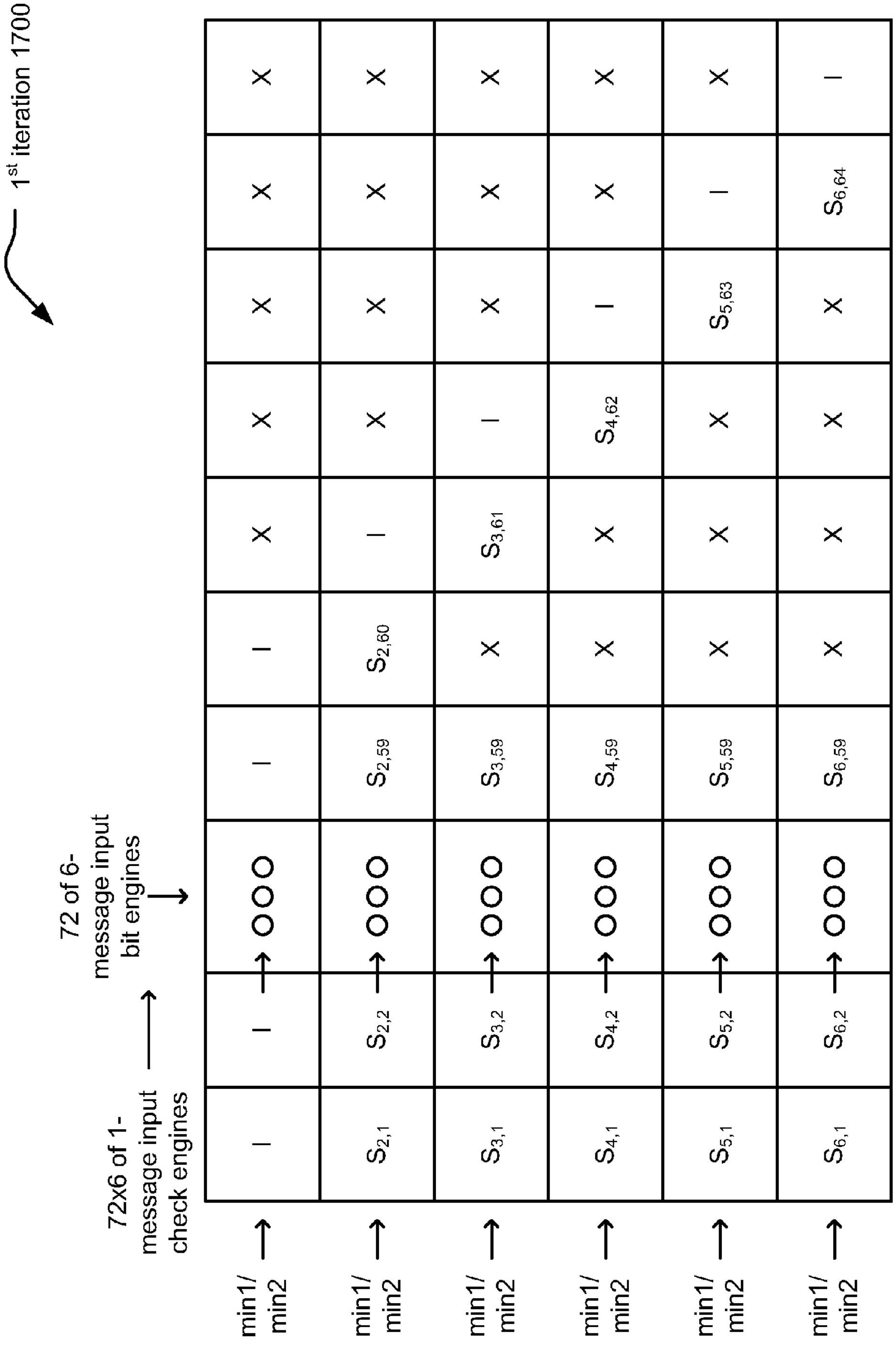

Referring to FIG. 17 in which a first decoding iteration 1700 of the third column of sub-matrices of the LDPC matrix, H, is performed, it can be seen that the bit edge messages for each of the 6 sub-matrices within the third column of the LDPC matrix, H, are updated using the most recently updated check edge messages (i.e., min1 or min2) for those sub-matrices and the calculated bit metric of the received signal for that column. Also, the check nodes of the sub-matrices of the second column of the LDPC matrix, H, are now processed using the just updated bit edge messages as performed in FIG. 16.

This processing continues accordingly passing through all of the columns of sub-matrices of the LDPC matrix, H.

Figure 18:
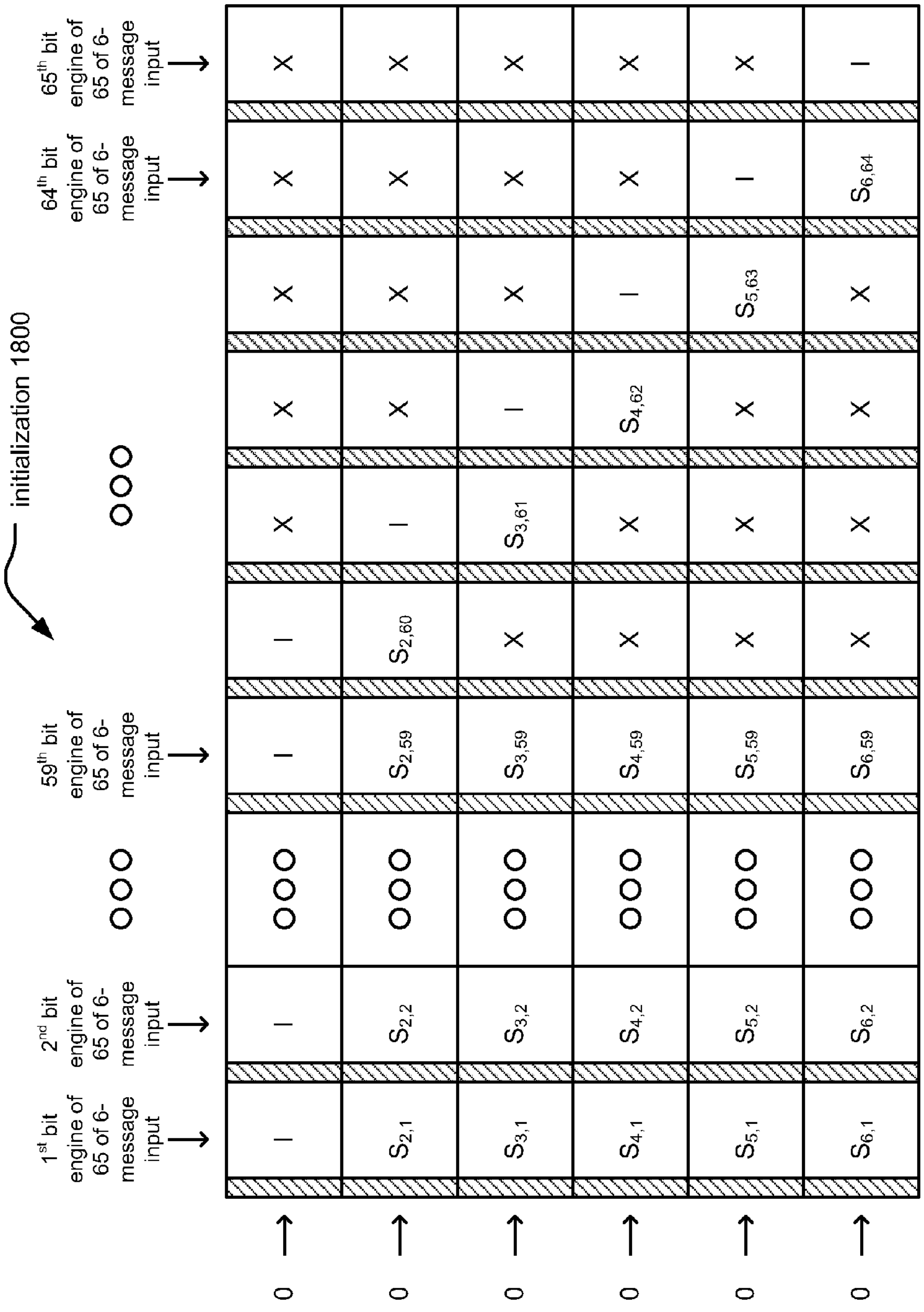
FIG. 18 illustrates an alternative embodiment of overlapping sub-matrix based decoding for an LDPC coded signal whose LDPC matrix, H, having (1) 72×72 sized CSI (Cyclic Shifted Identity) sub-matrices, (2) bit degree of 6,2,1 and check degree of 60,61, and (3) a total number of edges of 26,280.

FIG. 18 illustrates an alternative embodiment of overlapping sub-matrix based decoding for an LDPC coded signal whose LDPC matrix, H, having (1) 72×72 sized CSI (Cyclic Shifted Identity) sub-matrices, (2) bit degree of 6,2,1 and check degree of 60,61, and (3) a total number of edges of 26,280.

Referring to FIG. 18 in which initialization 1800 of the first column of sub-matrices of the LDPC matrix, H, is performed, it can be seen that the bit edge messages for each of the 6 sub-matrices within the first column of the LDPC matrix, H, are initialized using the corresponding, calculated bit metrics of a received signal for that column. The check edge messages are all initialized to be 0 as well for these 6 sub-matrices. In this as well as in other embodiments, the check edge messages could alternatively be initialized to another value besides 0 without departing from the scope and spirit of the invention.

These sub-matrices of the first column are shown as I, $S_{2,1}$, $S_{3,1}$, $S_{4,1}$, $S_{5,1}$, and $S_{6,1}$. The input to the bit engines is 65 of 6-message inputs (e.g., each of the sub-matrices is a 72×72 sized sub-matrix).

In this alternative embodiment, there is one bit engine for each sub-matrix column of the entire LDPC matrix, H. In other words, there are 65 bit engines employed (one for each sub-matrix column). In this embodiment, it can be seen that there are 65 bit engines (one bit engine for each sub-matrix column of the entire LDPC matrix, H), and 72 cycles are employed to perform the bit node processing (as there are 72 columns in each sub-matrix columns of the entire LDPC matrix, H).

During a first cycle, a first corresponding column of each sub-matrix is processed (as shown by the shaded portion). More specifically referring to the diagram, a $1^{st}$ bit engine of the 65 bit engines processes one column of the first sub-matrix column of the LDPC matrix, H, while a $2^{nd}$ bit engine of the 65 bit engines processes one column of the second sub-matrix column of the LDPC matrix, H, and so on so that one column of each sub-matrix column of the LDPC matrix, H, is being processed at the same time. Because there are 72 columns in each sub-matrix, it takes 72 cycles for the 65 bit engines to perform bit node processing of the entire LDPC matrix, H.

Although the left-hand most column of each sub-matrix is shown as being shaded, it is noted that any desired order of the individual columns could be performed within each of the corresponding sub-matrix columns when performing bit node processing.

Moreover, it is noted that other various embodiments could alternatively be employed without departing from the scope and spirit of the invention. For example, any number "n" bit engines could alternatively be provisioned to each sub-matrix column of the entire LDPC matrix, H (as opposed to only 1 bit engine per sub-matrix column as shown in FIG. 18).

If n=2, then 130 bit engines could be employed so that there are 2 bit engines provisioned to each sub-matrix column of the LDPC matrix, H. A $1^{st}$ and $2^{nd}$ bit engine of the 130 bit engines would process two columns, respectively, of the first sub-matrix column of the LDPC matrix, H, while a $3^{rd}$ and $4^{th}$ bit engine of the 130 bit engines would process two columns, respectively, of the second sub-matrix column of the LDPC matrix, H, and so on so that two column of each sub-matrix column of the LDPC matrix, H, is being processed at the same time. Because there are 72 columns in each sub-matrix, it takes 36 cycles for the 130 bit engines to perform bit node processing of the entire LDPC matrix, H. Clearly, other variations could also be implemented without departing from the scope and spirit of the invention.

If n=3, then 195 bit engines could be employed so that there are 3 bit engines provisioned to each sub-matrix column of the LDPC matrix, H. A 1st, 2nd, and 3rd bit engine of the 195 bit engines would process three columns, respectively, of the first sub-matrix column of the LDPC matrix, H, while a 4th, 5th, 6th bit engine of the 195 bit engines would process three columns, respectively, of the second sub-matrix column of the LDPC matrix, H, and so on so that three column of each sub-matrix column of the LDPC matrix, H, is being processed at the same time. Because there are 72 columns in each sub-matrix, it takes 24 cycles for the 195 bit engines to perform bit node processing of the entire LDPC matrix, H. Clearly, other variations could also be implemented without departing from the scope and spirit of the invention.

Some of these above embodiments (e.g., as described with respect to FIG. 18) describe processing multiple individual columns within each sub-matrix column at a time. However, it is also noted that multiple sub-matrix column could also be processed at the same time as well. For example, if each sub-matrix column is 72 columns wide (e.g., each sub-matrix is a 72×72 sub-matrix), then one can process 144 columns (i.e., 2 sub-matrix columns) at a time. In this example, if the entire LDPC matrix, H, is composed of sub-matrix columns and sub-matrix rows such that each sub-matrix column is 72 columns of the LDPC matrix, H, wide and each sub-matrix row is 72 rows of the LDPC matrix, H, wide, then any multiple integer of sub-matrix columns can processed at the same time. Generally speaking, any number of columns (e.g., n×(# of sub-matrix columns)) can be processed at the same time. In this example where each sub-matrix column is 72 columns of the LDPC matrix, H, wide, then any number of columns (n×72) can be processed at the same time. If 2 sub-matrix columns are processed at the same time, then this would employ 144 bit engines such that each bit engine would have 6 message inputs. There would then be 72×6 check engines such that each check engine would receive 2 message inputs.

It is also noted that while many of the examples provided above correspond to bit node processing, clearly corresponding degrees of parallelism processing, sequential processing, and/or some combination thereof can equally be applied to check node processing as well as bit node processing. For example, each check engine of a plurality of check engines could have an increased number of inputs (e.g., twice as many inputs, or "n" as many inputs, as the embodiment depicted beginning with FIG. 9). A designer is provided a wide degree of flexibility in showing the amount of sequential and/or parallel processing to be employed when performing bit node processing and check node processing.

Figure 19:
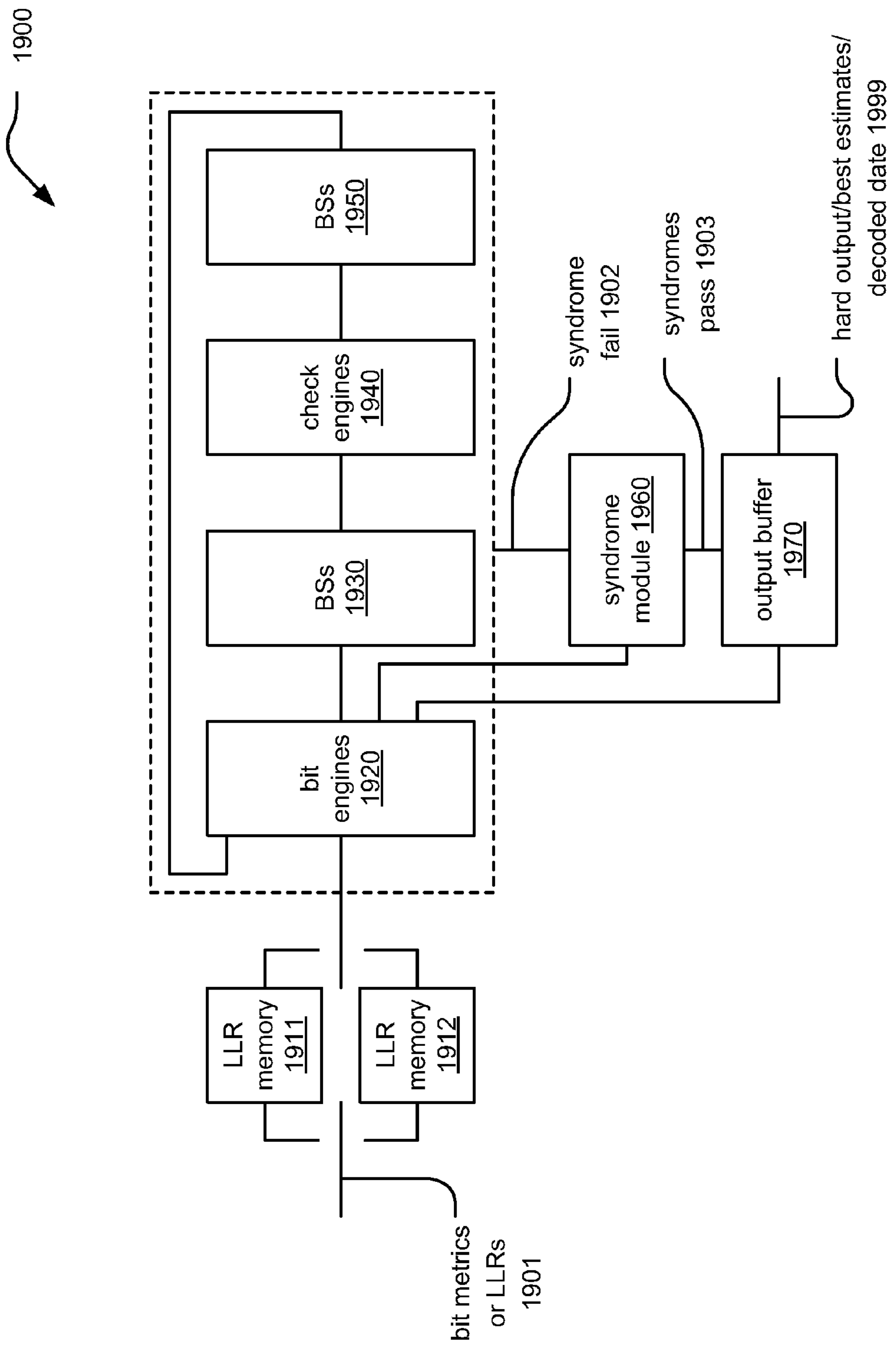
FIG. 19 illustrates an embodiment of an LDPC decoder employing min-sum processing.

FIG. 19 illustrates an embodiment of an LDPC decoder 1900 employing min-sum processing. A signal is received by the LDPC decoder 1900, and bit metrics or LLRs are calculated there from, as shown by reference numeral 1901.

These bit metrics or LLRs 1901 are then passed to a ping pong arrangement of LLR memory 1911 and LLR memory 1912. When bit metrics or LLRs are being written to LLR memory 1911, other bit metrics or LLRs are being read from LLR memory 1912, and vice versa.

The bit metrics or LLRs 1901, after being output from the LLR memory 1911 and the LLR memory 1912, are then provided to a plurality of bit engines 1920 for use in firstly performing initialization, and then for their use in updating of bit edge messages using the plurality of bit engines 1920. During initialization, the bit metrics or LLRs 1901 themselves are employed to initialize the bit edge messages within the plurality of bit engines 1920. Thereafter, these initialized bit edge messages are passed to a plurality of barrel shifters (shown as BSs 1930) and then to a plurality of check engines 1940 to perform updating of check edge messages (e.g., check node processing). The BSs 1930 are operable to align the bit edge messages appropriately for their use in updating of check edge messages within the plurality of check engines 1940. In one example, when the sub-matrices of the LDPC matrix, H, being used to decode the LDPC coded signal are CSI (Cyclic Shifted Identity) sub-matrices, then the BSs 1930 can operate to line up the bit edge messages appropriately. However, in an alternative embodiment, if sub-matrices of the LDPC matrix, H, being used to decode the LDPC coded signal are not of CSI format, then appropriate multiplexing would be employed in place of the BSs 1930 to line up the bit edge messages appropriately.

After the check edge messages have been updated within the plurality of check engines 1940, they are passed to a plurality of barrel shifters (shown as BSs 1950) and then back to the plurality of bit engines 1920 to perform updating of bit edge messages (e.g., bit node processing). The BSs 1950 are operable to align the check edge messages appropriately for their use in updating of bit edge messages within the plurality of bit engines 1920. In one example, when the sub-matrices of the LDPC matrix, H, being used to decode the LDPC coded signal are CSI (Cyclic Shifted Identity) sub-matrices, then the BSs 1950 can operate to line up the check edge messages appropriately.

The plurality of bit engines 1920 and the plurality of check engines 1950, along with the plurality of BSs 1930 and the plurality of BSs 1950 can continue the iterative decoding processing. The bit edge messages and the check edge messages are successively and alternatively updated using the plurality of bit engine 1920 and the plurality of check engines 1940 during the iterative decoding processing.

During each or selected decoding iterations, soft output can be generated by the plurality of bit engines 1920 using the most recently updated check edge messages as well as the bit metrics or LLRs 1901 themselves, and this soft output can undergo hard limiting and be passed to an output buffer 1970 (e.g., the hard limiting can be performed within the output buffer 1970) from which hard output/best estimates/decoded data 1999 can be output.

The soft output can also undergo hard limiting and be passed to a syndrome module 1960 that can determine whether all syndromes of the LDPC code pas or fail (e.g., whether all syndromes are equal to zero or not). If all of the syndromes of the LDPC code pass (as shown by reference numeral 1903), then the hard output/best estimates/decoded data 1999 can be output from the output buffer 1970. Alternatively, if one or more than one of the syndromes of the LDPC code fail (as shown by reference numeral 1902), then additional decoding iterations can be performed. Alternatively, simply a fixed number of decoding iterations can be performed, and then the hard output/best estimates/decoded data 1999 generated using that number of decoding iterations can be output from the output buffer without needing to check the syndromes.

Perhaps most notable in the embodiment of FIG. 19 is the fact that no message passing memory is required for storing all of the check edge messages or all of the bit edge messages that are passed between the plurality of bit engines 1920 and the plurality of check engines 1940.

In this embodiment, each of the bit metrics or LLRs 1901 can be of size 6 bits. Each of the LLR memory 1911 and the LLR memory 1912 can be operable to store 65×72×6 bits, and as such 72 bit metrics or LLRs 1901 can be output from the LLR memories 1911 and 1912 (i.e., 72×6 bits output there from). The plurality of bit engines 1920 includes 72 bit engines operable to process 6-inputs each. Each of the plurality of BSs 1930 and the plurality of BSs 1950 can be implemented to process 6×6 inputs of 72 bits, and the plurality of check engines 1940 includes 72×6 check engines operable to process 1-input each. The check edge messages provided from the plurality of check engines 1940 back to the plurality of bit engines 1920 can be in the form of 72×6×6 bits (72×6 edges).

The decoded output that is provided from the plurality of bit engines 1920 to the syndrome module 1960 and the output buffer 1970 can be in the form of 72 bits.

Figure 20:
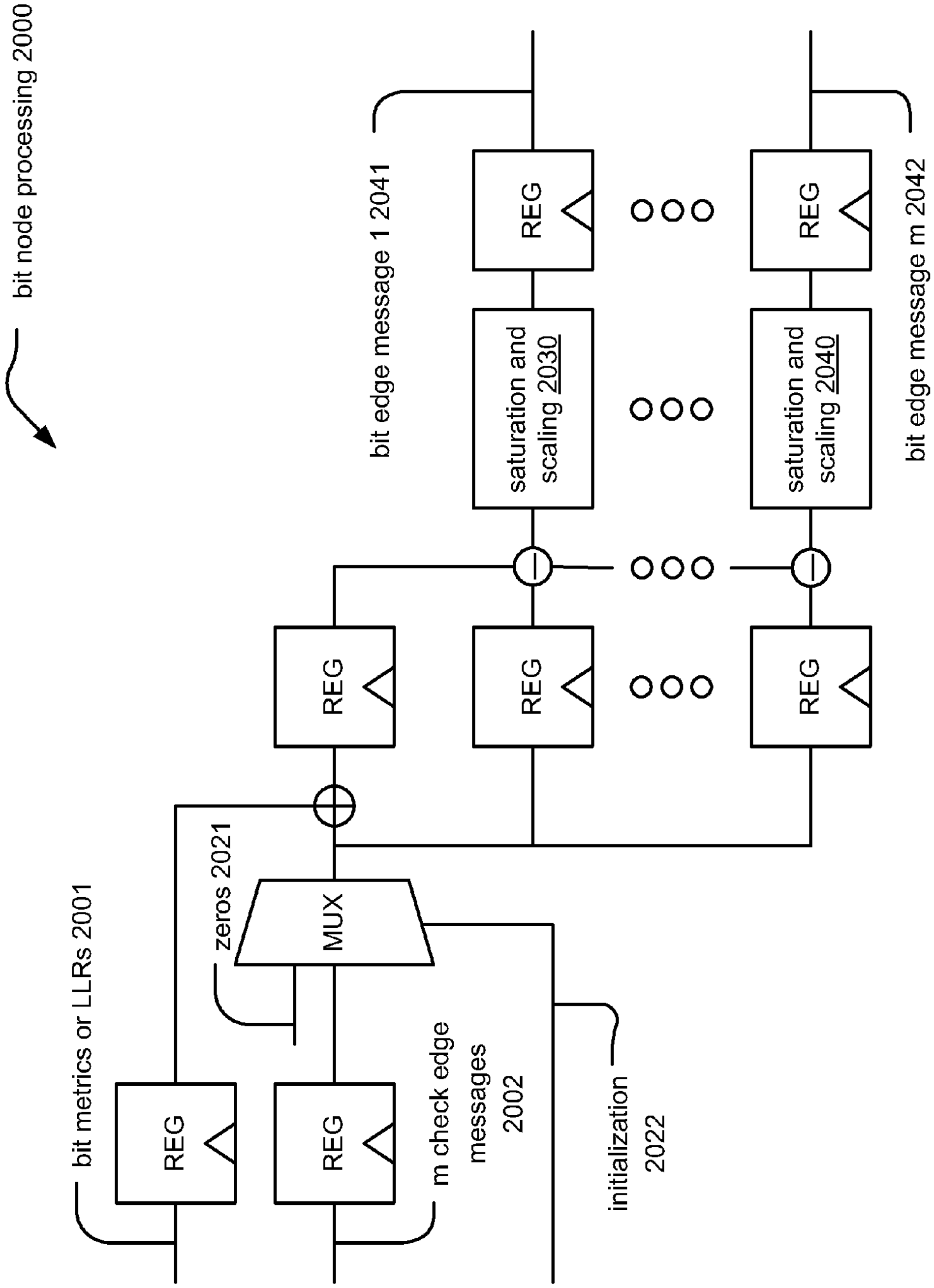
FIG. 20 illustrates an embodiment of bit node processing as can be employed within LDPC decoding.
Figure 21:
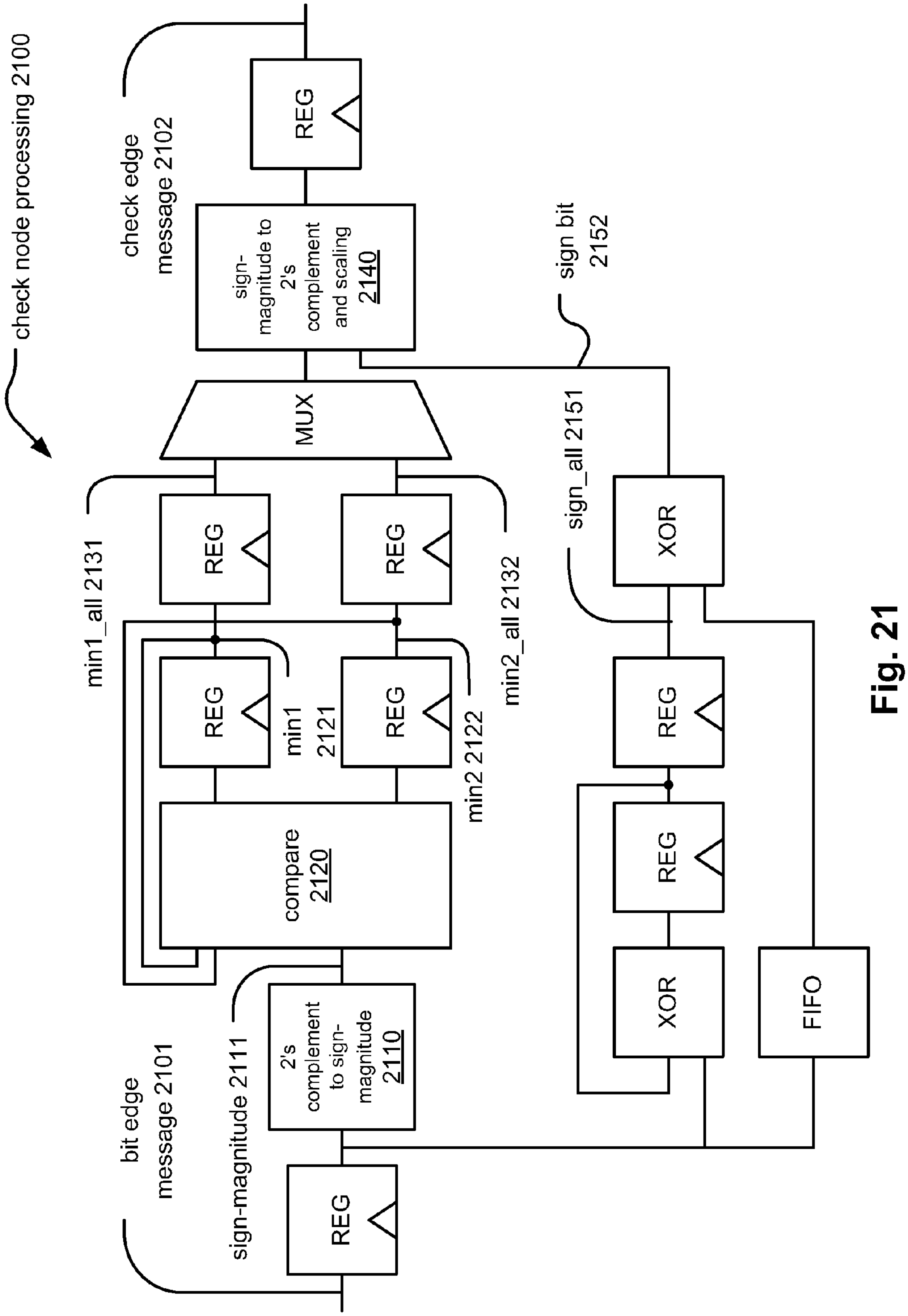
FIG. 21 illustrates an embodiment of check node processing as can be employed within LDPC decoding.

FIG. 20 and FIG. 21 describe some possible embodiments by which updating of bit edge messages (i.e., bit node processing) and updating of check edge messages (i.e., check node processing) can be performed.

FIG. 20 illustrates an embodiment of bit node processing 2000 as can be employed within LDPC decoding. Registers (shown as REG in the diagram) are implemented to receive bit metrics or LLRs 2001 and m check edge messages 2002. A multiplexor (MUX) is operable to select between the m check edge messages 2002 and zeros 2021 (or some other predetermined values) based on whether or not the bit node processing 2000 is performing initialization of merely a normal decoding iteration. The output of the MUX is added to the bit metrics or LLRs 2001 output from the top register, and this summed value is provided to a register. The output of the MUX is passed to each of the other REGs shown as being separated by the vertically aligned ellipsis (i.e., ○ ○ ○). For updating each bit edge message, the output from the MUX is subtracted from the output of the top register and then passed to a corresponding saturation and scaling module.

For example, to update the bit edge message 1 2041, the output of the MUX is subtracted from the summer value that is output from the register at the top of the vertically aligned ellipsis, and that resultant is provided to a saturation and scaling module 2030 and then to a subsequent register.

Analogous connectivity and processing is performed, so that, to update a bit edge message for a particular bit node, each of the bit edge messages corresponding to edges that connect to that particular bit node are employed except for that very bit edge message. Functionality according t this diagram achieves this functionality.

FIG. 21 illustrates an embodiment of check node processing 2100 as can be employed within LDPC decoding. This embodiment of check node processing 2100 employs min-sum processing. One or more bit edge messages 2101 is provided to a register, whose output is provide to a module 2110 that is operable to convert a 2's complement number to sign-magnitude format; the sign-magnitude of the number, shown by reference numeral 2111, is then output there from. A compare module 2120 it determine and output a true minimum (min1 shown by reference numeral 2121) and a second most minimum (min2 shown by reference numeral 2122) value from among the bit edge messages 2101. After processing all of the input bit edge messages, a true minimum for all of the inputs (min1_all shown by reference numeral 2131) and a second most minimum for all of the inputs (min2_all shown by reference numeral 2132) are then output to a MUX. Depending on which check edge message is being updated, either the true minimum for all of the inputs (min1_all shown by reference numeral 2131) or the second most minimum for all of the inputs (min2_all shown by reference numeral 2132) is provided to a module 2140 that is operable to convert a sign-magnitude formatted number to a 2's complement number and perform any appropriate scaling thereof.

In addition, the input bit edge messages 2101 are also provided to an XOR (exclusive-OR module) that operates in conjunction with two registers to provide a sign bit for all of the input bit edge messages 2101 (shown as sign_all 2151). The input bit edge messages 2101 are also provided to a FIFO (First-In/First-Out) module. The output of the FIFIO and the sign_all 2151 are then also provided to another XOR module from which a sign bit 2152 is output. This sign bit 2152 is provided to the module 2140.

The module 2140 that is operable to convert a sign-magnitude formatted number to a 2's complement number and perform any appropriate scaling thereof receives the output from the MUX and the sign bit 2152 to generate the updated check edge message 2102.

It is also noted that a wide variety of designs to perform bit node processing and check node processing, besides the bit node processing 2000 and the check node processing 2100 depicted above, can be employed without departing from the scope and spirit of the invention.

Figure 22:
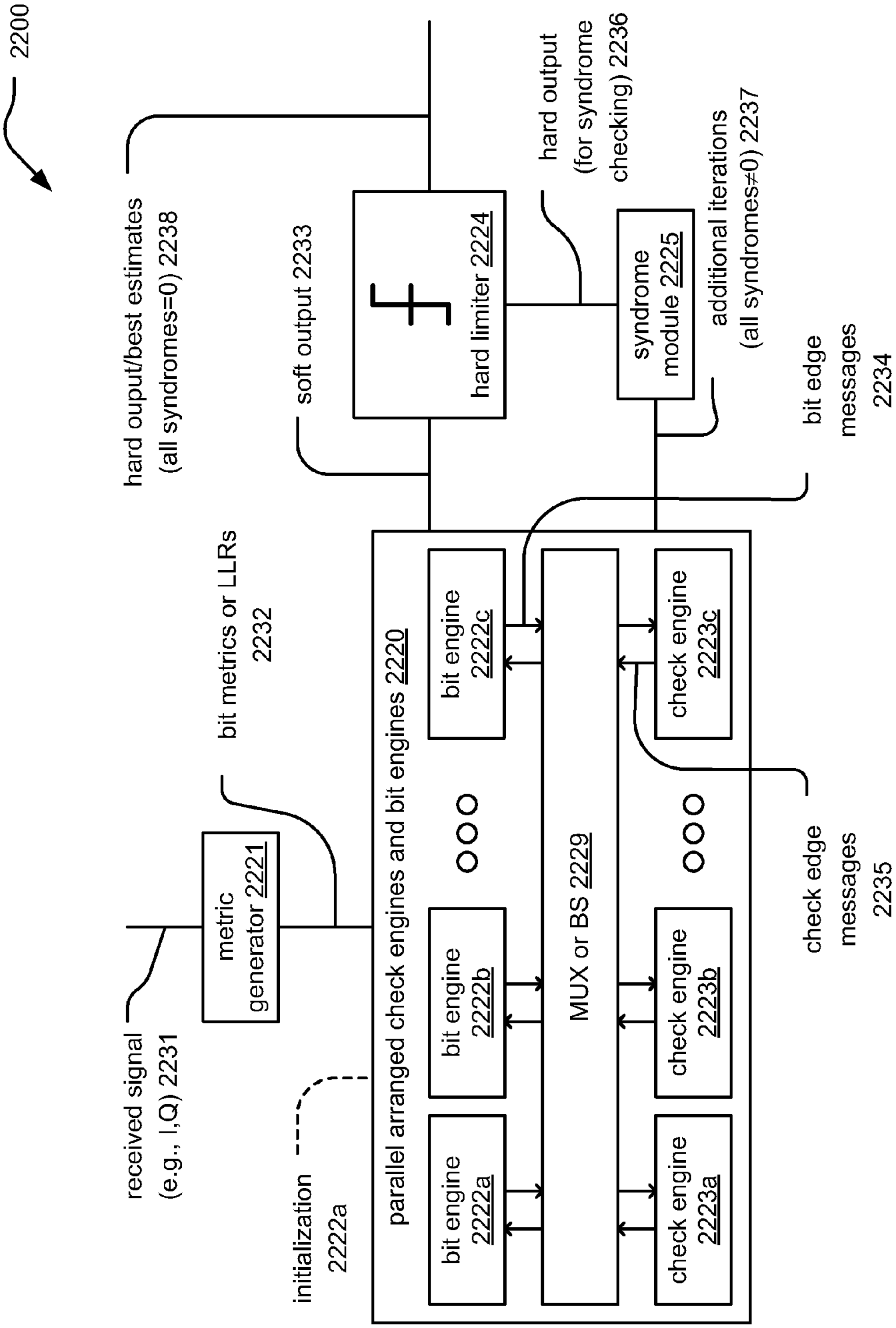
FIG. 22 illustrates an embodiment of an LDPC decoder employing parallel arranged bit engines and parallel arranged check engines.

FIG. 22 illustrates an embodiment of an LDPC decoder 2200 employing parallel arranged bit engines and parallel arranged check engines. A received signal 2231 is provided to a metric generator 2221. The metric generator 2221 can calculate symbol metrics (e.g., in the context of when a higher order modulation signal is employed) and then calculate bit metrics or LLRs (log likelihood ratios) there from, as shown by reference numeral 2232. For example, when a higher order modulation signal is used, the symbol metrics are calculated for each received symbol in view of the constellation shape and mapping employed. Then, these symbol metrics can be decomposed into bit metrics for the individual bits of the symbols.

These bit metrics or LLRs 2232 are then passed to parallel arranged check engines and bit engines, as shown by reference numeral 2220. The plurality of bit engines **2222*a*, 2222*b*-2222*c* employ the metrics or LLRs 2232 firstly to perform initialization, as shown by reference numeral 2222*a*. During the initialization 2222*a*, the bit metrics or LLRs 2232 themselves are employed to initialize the bit edge messages within the plurality of bit engines 2222*a*, 2222*b*-2222*c*. Thereafter, these initialized bit edge messages are passed via a multiplexor (MUX) or BS (Barrel Shifter) 2229 to a plurality of check engines 2223*a*, 2223*b*-2223*c* to perform updating of check edge messages (e.g., check node processing) and the updated check edge messages are then passed back via the MUX or BS 2229 to the plurality of bit engines 2222*a*, 2222*b*-2222*c*** to continue the iterative decoding processing.

As also described above within another embodiment, for appropriate re-alignment of either the bit edge messages or the check edge messages when the LDPC matrix, H, has a randomly permuted format, a MUX can be employed. Alternatively, if the LDPC matrix, H, has a format of a CSI (Cyclic Shifted Identity) matrix, then a BS can be employed within the module indicated by reference numeral 2229.

Generally speaking, bit edge messages 2234 and the check edge messages 2235 are successively and alternatively updated using the plurality of bit engines **2222*a*, 2222*b*-2222*c* and the plurality of check engines 2223*a*, 2223*b*-2223*c*** during the iterative decoding processing.

During each or selected decoding iterations, soft output 2233 is generated by the plurality of bit engines **2222*a*, 2222*b*-2222*c* using the most recently updated check edge messages as well as the bit metrics or LLRs 2221 themselves, and this soft output 2233 is passed to a hard limiter 2224 that generates hard output/best estimates 2238 to determine whether all syndromes of the LDPC code are equal to zero or not, as determined by a syndrome module 2225. The hard output 2236 is provided to the syndrome module 2225** to make this determination. If all of the syndromes of the LDPC code are equal to zero, then the hard output/best estimates 2238 can be output from the decoder 2220. Alternatively, if all of the syndromes of the LDPC code are not equal to zero, then additional decoding iterations can be performed using the plurality of bit engines 2222*a*, 2222*b*-2222*c* and the plurality of check engines 2223*a*, 2223*b*-2223*c*. Alternatively, simply a fixed number of decoding iterations can be performed, and then the hard output/best estimates 2238 generated using that number of decoding iterations can be output from the decoder 2220 without needing to check the syndromes.

As within other embodiments, there are a variety of means in which the updating to generate the check edge messages can be performed including Gallager function that employs tanh(x) and $\tanh^{-1}(x)$ functions, min processing, min-sum processing, min* (min-star) processing, min** (min-double-star) processing, and many other processing types as well.

Figure 23:
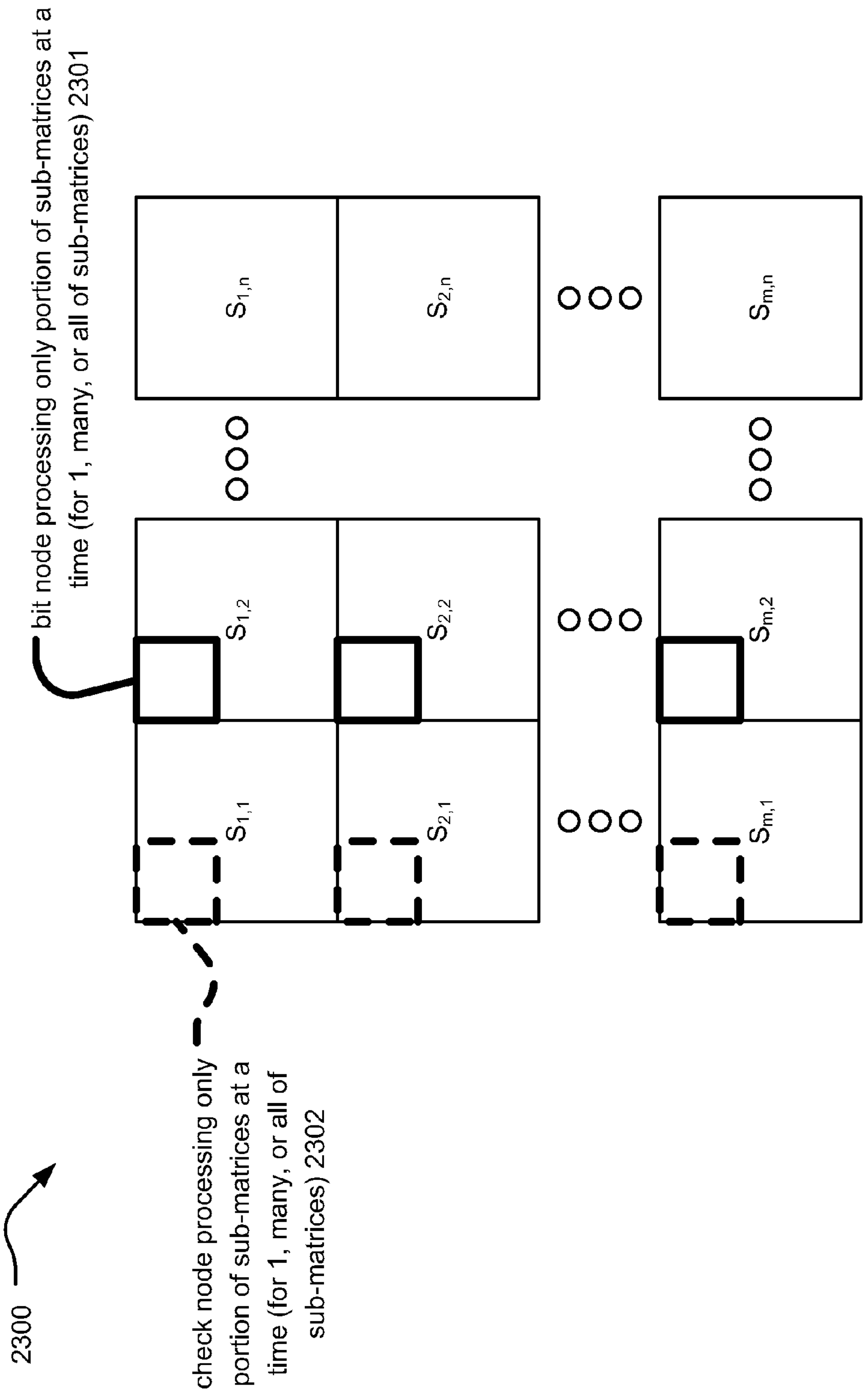
FIG. 23 illustrates an embodiment of a LDPC matrix, H, showing how decoding processing can be applied to a portion of 1, many or all sub-matrices thereof.

FIG. 23 illustrates an embodiment of a LDPC matrix, H, 2300 showing how decoding processing can be applied to a portion of 1, many or all sub-matrices thereof. In many of the embodiments depicted above, all of the bit edge messages and then the check edge messages for a particular sub-matrix are updated, respectively. However, alternative implementations can be made such that only part of one or more sub-matrices can be processed. For example, a first portion of one or more sub-matrices can undergo updating of bit edge messages (e.g., as shown by reference numeral 2301), and then that first portion of one or more sub-matrices can undergo updating of check edge messages corresponding to that first portion (e.g., as shown by reference numeral 2302). Again, as within other embodiments, a parallel architecture including more than one bit engine and more than one check engine can be employed to perform simultaneous processing of portions of multiple sub-matrices at a time.

Figure 24:
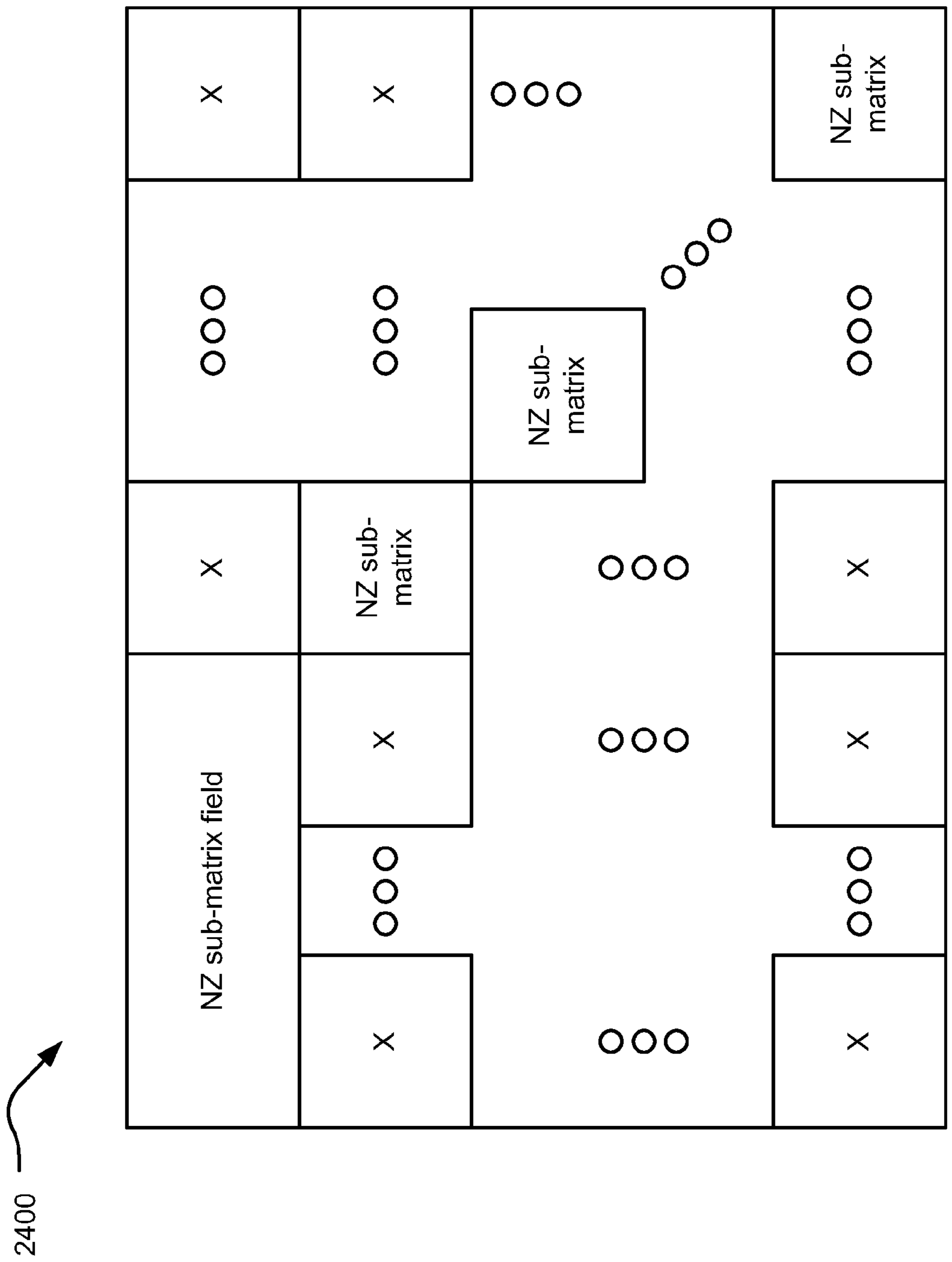
FIG. 24 illustrates an embodiment of a LDPC matrix, H, having a matrix structure designed for efficient decoding processing by an overlapping sub-matrix based LDPC decoder.

FIG. 24 illustrates an embodiment of a LDPC matrix, H, 2400 having a matrix structure designed for efficient decoding processing by an overlapping sub-matrix based LDPC decoder. As within other embodiments, each of the sub-matrices of the LDPC matrix, H, depicted by an "X" is an all zero-valued sub-matrix (i.e., all elements therein are zero valued). Each of the other matrices is a non-zero valued sub-matrix, and these zero-valued sub-matrices are depicted by NZ sub-matrix. In this embodiment, a non-zero sub-matrix field (located at the upper left hand corner portion of the LDPC matrix, H) includes a plurality of non-zero sub-matrices, and a number of other non-zero sub-matrices are aligned along a diagonal extending from the bottom right corner of the lower right hand corner portion of the LDPC matrix, H.

In this embodiment, each of the non-zero sub-matrices can be a squared shaped sub-matrix (i.e., an x×x sub-matrix, where x is an integer). This particular LDPC matrix, H, structure lends itself well to overlapping sub-matrix based LDPC decoding. If desired, once an LDPC matrix, H, is constructed, then appropriately desired row and column permuting may be performed to arrange the LDPC matrix, H, in a format to accommodate any of a wide variety of applications including those in which it is desirable to have randomly distributed sub-matrices, CSI (Cyclic Shifted Identity) type sub-matrices, and/or any other type of structures for a LDPC matrix, H.

Figure 25:
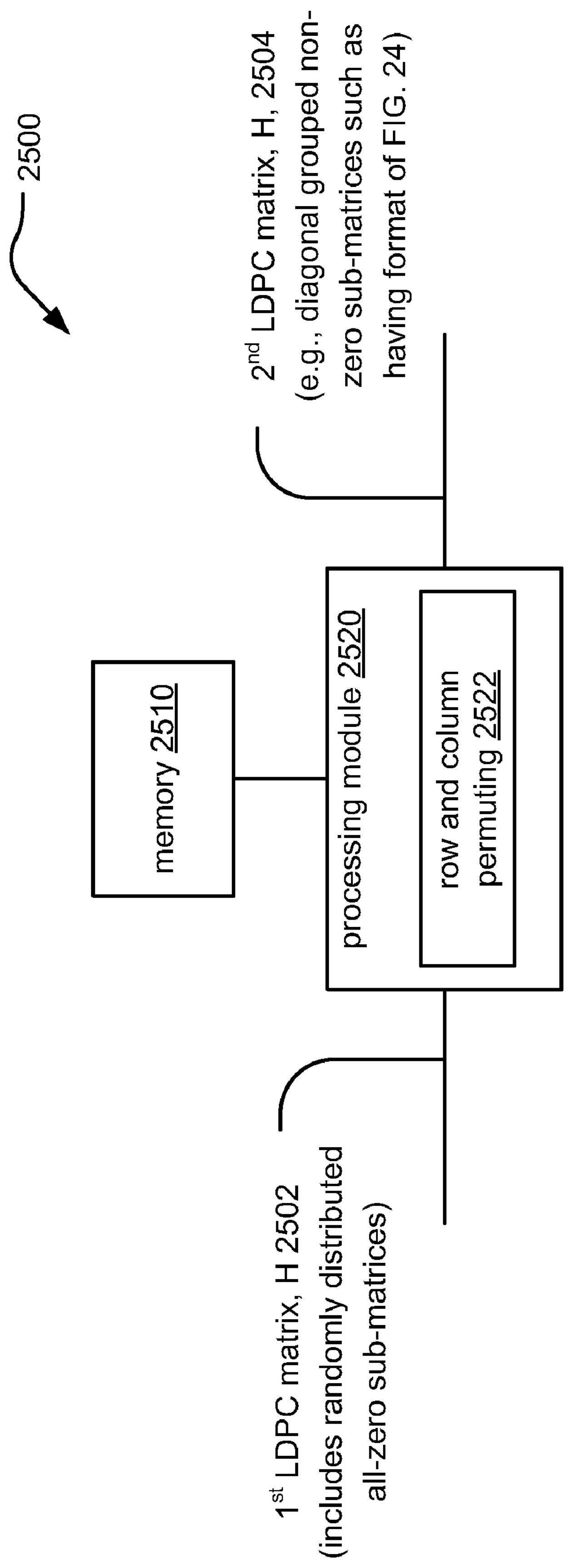
FIG. 25 illustrates an embodiment of an apparatus that is operable to perform row and column permuting of an LDPC matrix, H, to get it into a form that is similar to that of FIG. 24.

FIG. 25 illustrates an embodiment of an apparatus 2500 that is operable to perform row and column permuting of an LDPC matrix, H, to get it into a form that is similar to that of FIG. 24. The apparatus 2500 includes a processing module 2520, and a memory 2510. The memory 2510 is coupled to the processing module, and the memory 2510 is operable to store operational instructions that enable the processing module 2520 to perform a variety of functions. The processing module 2520 is operable to perform the appropriate processing to generate at least one LDPC matrix corresponding to at least one LDPC code using any of the approach presented herein. In one embodiment, the processing module 2520 is operable to perform row and column permuting to transform a first LDPC matrix, H, 2502 into a second LDPC matrix, H, 2504. The first LDPC matrix, H, 2502, includes randomly distributed sub-matrices that include all zero-valued elements.

One such example of an LDPC matrix, H, that includes this format is that employed in accordance with DVB-S2. For example, the use of LDPC coded signals continues to be explored within many newer application areas. One such application area is that digital video broadcasting. The Digital Video Broadcasting Project (DVB) is an industry-led consortium of over 260 broadcasters, manufacturers, network operators, software developers, regulatory bodies and others in over 35 countries committed to designing global standards for the global delivery of digital television and data services. Publicly available information concerning the DVB is available at the following Internet address:

"http://www.dvb.org/"

The DVB-S2 (i.e., DVB-Satellite Version 2) standard has been developed by members of the Digital Video Broadcasting Project (DVB).

The processing module 2520 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 2510 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1120 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

When an LDPC matrix, H, has a format such that it includes a number of randomly distributed sub-matrices that include all zero-valued elements, this can require a significant amount of memory to store the LDPC matrix, H. For example, the LDPC matrix, H, of the DVB-S2 includes 60 rows, but the degree of the LDPC matrix, H, is only ten (10), so that only 10 of the rows of the LDPC matrix, H, include non-zero elements. Nevertheless, if the entire LDPC matrix, H, of the DVB-S2 needs to be stored, then much more memory is required than if some optimization of the LDPC matrix, H, can be made so that the entirety of the LDPC matrix, H, need not be stored explicitly. For example, if the first LDPC matrix, H, 2502 (that includes randomly distributed sub-matrices that include all zero-valued elements) is transformed into the second LDPC matrix, H, 2504 (that is of a more diagonal grouping of the non-zero sub-matrices such as in accordance with the embodiment of FIG. 24), then a significant savings of memory can be achieved, in that, only the upper left most non-zero locations need to be stored in memory. All of the all-zero-valued sub-matrices can be stored using much more efficient means such as a flag or some other memory optimization means (since these all all-zero-valued sub-matrices include no information).

If desired in some embodiments, the parity check matrix of the LDPC code can be provided from the apparatus 2500 to a communication system that is operable to employ and perform error correcting coding using that LDPC code. The parity check matrix of the LDPC code can also be provided from the apparatus 2500 to any of a variety of communication devices implemented within a communication system as well. This way, a completely integrated means is provided by which the parity check matrix of the LDPC code can be constructed in hardware and provided to one or more the communication devices implemented within a communication system to employ that LDPC code.

Figure 26:
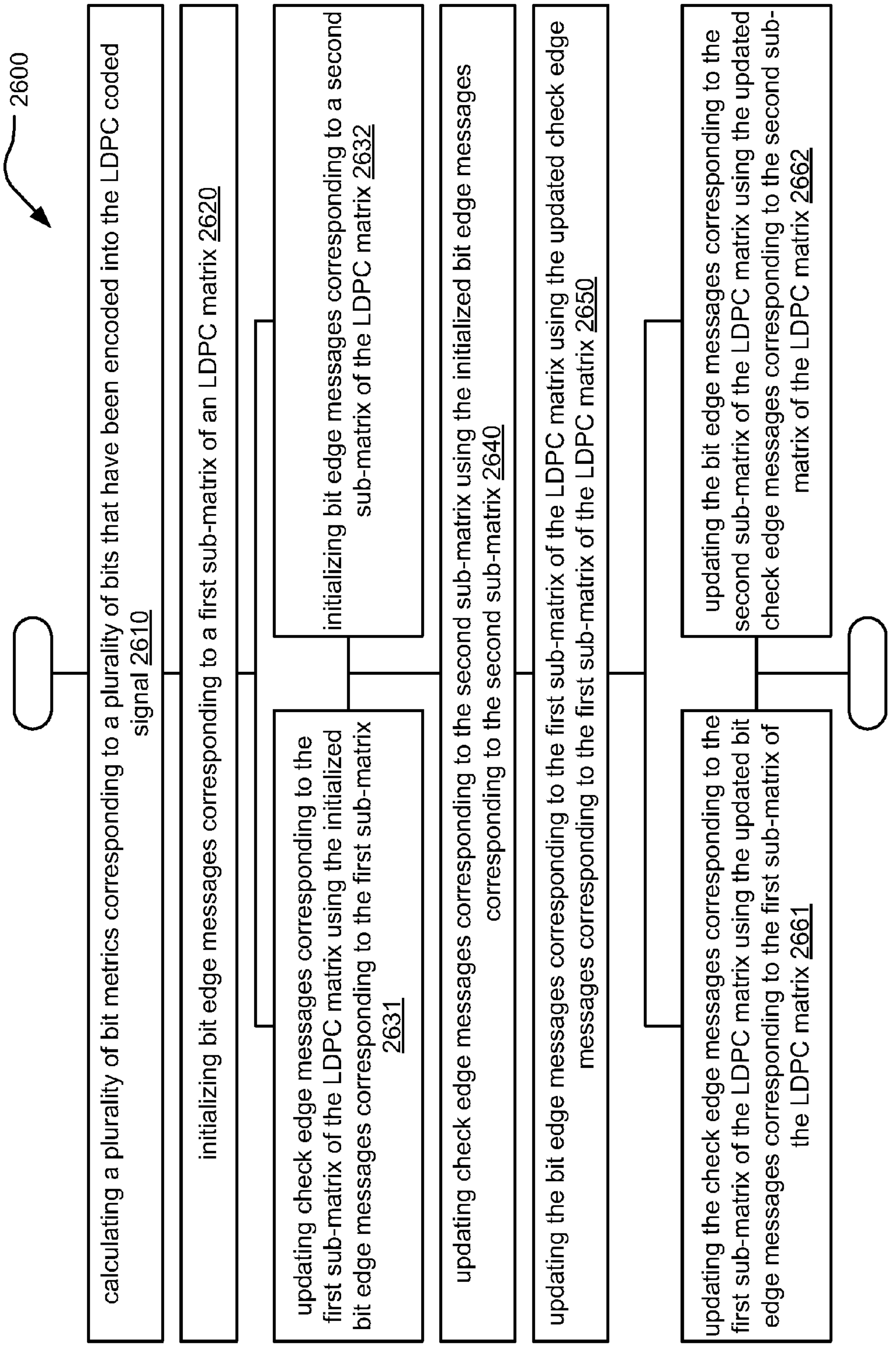
FIG. 26 illustrates an embodiment of a method for performing overlapping sub-matrix based decoding of an LDPC coded signal.

FIG. 26 illustrates an embodiment of a method 2600 for performing overlapping sub-matrix based decoding of an LDPC coded signal. The method 2600 begins by calculating a plurality of bit metrics corresponding to a plurality of bits that have been encoded into the LDPC coded signal, as shown in a block 2610. Then, the method 2600 continues by initializing bit edge messages corresponding to a first sub-matrix of an LDPC matrix during a first time, as shown in a block 2620.

During a second time, operations of blocks 2631 and 2632 can occur substantially simultaneously. As shown in the block 2631, the method 2600 operates by updating check edge messages corresponding to the first sub-matrix of the LDPC matrix using the initialized bit edge messages corresponding to the first sub-matrix. Also, the method 2600 operates by initializing bit edge messages corresponding to a second sub-matrix of the LDPC matrix.

During a third time, the method 2600 operates by updating check edge messages corresponding to the second sub-matrix using the initialized bit edge messages corresponding to the second sub-matrix, as shown in a block 2640.

During a fourth time, the method 2600 operates by updating the bit edge messages corresponding to the first sub-matrix of the LDPC matrix using the updated check edge messages corresponding to the first sub-matrix of the LDPC matrix, as shown in a block 2650.

During a fifth time, operations of blocks 2661 and 2662 can occur substantially simultaneously. As shown in the block 2661, the method 2600 operates by updating the check edge messages corresponding to the first sub-matrix of the LDPC matrix using the updated bit edge messages corresponding to the first sub-matrix of the LDPC matrix. Also, as shown in the block 2662, the method 2600 operates by updating the bit edge messages corresponding to the second sub-matrix of the LDPC matrix using the updated check edge messages corresponding to the second sub-matrix of the LDPC matrix.

The following table is provided to show the comparison of (1) a prior art, conventional min-sum LDPC decoder (i.e., this is NOT a novel overlapping sub-matrix based LDPC decoder as described herein that uses min-sum processing for updating of check edge messages), and a (2) novel overlapping sub-matrix based LDPC decoder.

| LDPC decoder type | Cell type | Clock | Timing margin | Area (mm^2) | Power | Uncoded data throughput |
|---|---|---|---|---|---|---|
| Prior art conventional min-sum LDPC decoder | Low/Std Vt | 400/200 MHz | 20% | 3.5 | 0.69 W | 2.08 Gbps |
| Overlapping sub-matrix based LDPC decoder: 72 Bit engines of 6 inputs (6 bits) | Std Vt | 250 MHz | 20% | 1.71 | 0.33 W | 2.02 Gbps |

As can be seen, the uncoded data throughput is very comparable for both of these LDPC decoders (i.e., 2.08 Gbps vs. 2.02 Gbps). However, the power required by an overlapping sub-matrix based LDPC decoder is less than one-half that required by a prior art, conventional min-sum LDPC decoder (i.e., 0.33 W vs. 0.69 W). Also, because of the radically reduced memory requirements for the overlapping sub-matrix based LDPC decoder, the area of each of these two decoder types is very different, and the overlapping sub-matrix based LDPC decoder only requires less than one-half of the area required by a prior art, conventional min-sum LDPC decoder (i.e., 1.71 square milli-meters vs. 3.5 square milli-meters).

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:

a bit engine for updating bit edge messages corresponding to a first sub-matrix of an LDPC (Low Density Parity Check) matrix; and a check engine, communicatively coupled to the bit engine, for updating check edge messages corresponding to the first sub-matrix of the LDPC matrix while the bit engine updating bit edge messages corresponding to a second sub-matrix of the LDPC matrix; and wherein:

the apparatus employing most recently updated bit edge messages corresponding to at least one of the first sub-matrix and the second sub-matrix to make a best estimate of an information bit encoded within an LDPC coded signal.

2. The apparatus of claim 1, wherein:

the LDPC includes a plurality of sub-matrix columns;

the first sub-matrix of the LDPC matrix is located within a first of the plurality of sub-matrix columns; and the second sub-matrix of the LDPC matrix is located within a second of the plurality of sub-matrix columns.

3. The apparatus of claim 1, further comprising:

a plurality of bit engines that includes the bit engine; and a plurality of check engines, that includes the check engine, communicatively coupled to the plurality of bit engines; and wherein:

the LDPC includes a plurality of sub-matrix columns;

the first sub-matrix of the LDPC matrix is located within a first plurality of sub-matrices located within a first of the plurality of sub-matrix columns;

the second sub-matrix of the LDPC matrix is located within a second plurality of sub-matrices located within a second of the plurality of sub-matrix columns;

the plurality of bit engines updating respective bit edge messages corresponding to each of the first plurality of sub-matrices; and the plurality of check engines updating respective check edge messages corresponding to each of the first plurality of sub-matrices while the plurality of bit engines updating respective bit edge messages corresponding to each of the second plurality of sub-matrices.

4. The apparatus of claim 1, wherein:

the first sub-matrix is a first square sub-matrix; and the second sub-matrix is a second square sub-matrix.

5. The apparatus of claim 1, wherein:

the first sub-matrix is a first CSI (Cyclic Shifted Identity) sub-matrix; and the second sub-matrix is a second CSI sub-matrix.

6. The apparatus of claim 1, wherein:

the first sub-matrix is a first permuted identity sub-matrix; and the second sub-matrix is a second permuted identity sub-matrix.

7. The apparatus of claim 1, wherein:

the LDPC matrix includes a plurality of sub-matrix columns each having uniform width.

8. The apparatus of claim 1, wherein:

the LDPC matrix includes a plurality of sub-matrices that includes the first sub-matrix and the second sub-matrix; and each of the plurality of sub-matrices that is located within a right hand portion of the LDPC matrix is an all zero-valued sub-matrices except for a plurality of non-zero sub-matrices located along a diagonal of the right hand portion of the LDPC matrix.

9. The apparatus of claim 1, further comprising:

a hard limiter for processing soft output associated with the most recently updated bit edge messages corresponding to at least one of the first sub-matrix and the second sub-matrix to make a plurality of hard decisions; and a syndrome module for employing the plurality of hard decisions to determine whether each syndrome of a plurality of syndromes corresponding to an LDPC code by which the LDPC coded signal is generated is equal to zero; and wherein:

if each syndrome of the plurality of syndromes is equal to zero, the hard limiter making the best estimate of the information bit within the LDPC coded signal; and if at least one syndrome of the plurality of syndromes is not equal to zero, the bit engine and the check engine performing at least one additional decoding iteration.

10. The apparatus of claim 1, wherein:

the apparatus is a communication device implemented within at least one of a satellite communication system, a wireless communication system, a wired communication system, and a fiber-optic communication system.

11. An apparatus, comprising:

a plurality of bit engines for updating respective bit edge messages corresponding to a first plurality of sub-matrices located within a first column of an LDPC (Low Density Parity Check) matrix; and a plurality of check engines, communicatively coupled to the plurality of bit engines, for updating respective check edge messages corresponding to the first plurality of sub-matrices located within the first column of the LDPC matrix while the plurality of bit engines updating respective bit edge messages corresponding to a second plurality of sub-matrices located within a second column of the LDPC matrix; and wherein:

the apparatus employing most recently updated bit edge messages corresponding to at least one of the first plurality of sub-matrices and the second plurality of sub-matrices to make a best estimate of an information bit encoded within an LDPC coded signal.

12. The apparatus of claim 11, wherein:

a first sub-matrix of at least one of the first plurality of sub-matrices and the second plurality of sub-matrices is a first square sub-matrix; and a second sub-matrix of at least one of the first plurality of sub-matrices and the second plurality of sub-matrices is a second square sub-matrix.

13. The apparatus of claim 11, wherein:

a first sub-matrix of at least one of the first plurality of sub-matrices and the second plurality of sub-matrices is a first CSI (Cyclic Shifted Identity) sub-matrix; and a second sub-matrix of at least one of the first plurality of sub-matrices and the second plurality of sub-matrices is a second CSI sub-matrix.

14. The apparatus of claim 11, wherein:

a first sub-matrix of at least one of the first plurality of sub-matrices and the second plurality of sub-matrices is a first permuted identity sub-matrix; and a second sub-matrix of at least one of the first plurality of sub-matrices and the second plurality of sub-matrices is a second permuted identity sub-matrix.

15. The apparatus of claim 11, wherein:

the first column of the LDPC matrix and the second column of the LDPC matrix each having uniform width.

16. The apparatus of claim 11, further comprising:

a hard limiter for processing soft output associated with the most recently updated bit edge messages corresponding to at least one of the first plurality of sub-matrices and the second plurality of sub-matrices to make a plurality of hard decisions; and a syndrome module for employing the plurality of hard decisions to determine whether each syndrome of a plurality of syndromes corresponding to an LDPC code by which the LDPC coded signal is generated is equal to zero; and wherein:

if each syndrome of the plurality of syndromes is equal to zero, the hard limiter making the best estimate of the information bit within the LDPC coded signal; and if at least one syndrome of the plurality of syndromes is not equal to zero, the plurality of bit engines and the plurality of check engines performing at least one additional decoding iteration.

17. The apparatus of claim 11, wherein:

the apparatus is a communication device implemented within at least one of a satellite communication system, a wireless communication system, a wired communication system, and a fiber-optic communication system.

18. A method, comprising:

employing a bit engine for updating bit edge messages corresponding to a first sub-matrix of an LDPC (Low Density Parity Check) matrix;

employing a check engine, communicatively coupled to the bit engine, for updating check edge messages corresponding to the first sub-matrix of the LDPC matrix while employing the bit engine for updating bit edge messages corresponding to a second sub-matrix of the LDPC matrix; and employing most recently updated bit edge messages corresponding to at least one of the first sub-matrix and the second sub-matrix to make a best estimate of an information bit encoded within an LDPC coded signal.

19. The method of claim 18, further comprising:

processing soft output associated with the most recently updated bit edge messages corresponding to at least one of the first sub-matrix and the second sub-matrix to make a plurality of hard decisions;

based on the plurality of hard decisions, determining whether each syndrome of a plurality of syndromes corresponding to an LDPC code by which the LDPC coded signal is generated is equal to zero;

if each syndrome of the plurality of syndromes is equal to zero, making the best estimate of the information bit within the LDPC coded signal; and if at least one syndrome of the plurality of syndromes is not equal to zero, employing the bit engine and the check engine for performing at least one additional decoding iteration.

20. The method of claim 18, wherein:

the first sub-matrix is a first permuted identity sub-matrix; and the second sub-matrix is a second permuted identity sub-matrix.

* * * * *